United States Patent
Chow et al.

(10) Patent No.: US 7,161,825 B2
(45) Date of Patent: Jan. 9, 2007

(54) MEMORY DEVICE, CIRCUITS AND METHODS FOR OPERATING A MEMORY DEVICE

(75) Inventors: David GenLong Chow, Los Altos, CA (US); Hans Ola Dahl, Stange (NO); Trygve Willassen, Oppegaard (NO)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/125,923

(22) Filed: May 9, 2005

(65) Prior Publication Data

US 2005/0201140 A1    Sep. 15, 2005

Related U.S. Application Data

(62) Division of application No. 10/218,396, filed on Aug. 14, 2002, now Pat. No. 6,920,060.

(51) Int. Cl.
*G11C 11/22* (2006.01)

(52) U.S. Cl. .................. 365/145; 365/207; 365/210

(58) Field of Classification Search .............. 365/65
See application file for complete search history.

(56) References Cited

U.S. PATENT DOCUMENTS

| | | | |
|---|---|---|---|
| 5,274,583 A | 12/1993 | Rapp | |
| 5,307,304 A | 4/1994 | Saito et al. | |
| 5,381,364 A | 1/1995 | Chern et al. | |
| 5,621,680 A * | 4/1997 | Newman et al. | 365/145 |
| 5,768,180 A | 6/1998 | Pohm | |
| 5,880,989 A | 3/1999 | Wilson et al. | |
| 6,061,266 A * | 5/2000 | Tan | 365/145 |
| 6,128,039 A | 10/2000 | Chen et al. | |
| 6,301,145 B1 | 10/2001 | Nishihara | |
| 6,310,812 B1 | 10/2001 | Pochmuller | |
| 6,333,870 B1 | 12/2001 | Kang | |
| 6,522,568 B1 * | 2/2003 | Nair | 365/145 |
| 6,529,398 B1 * | 3/2003 | Nair et al. | 365/145 |
| 6,611,448 B1 * | 8/2003 | Nair et al. | 365/145 |

(Continued)

FOREIGN PATENT DOCUMENTS

EP          0 486 901 A1     5/1992

(Continued)

OTHER PUBLICATIONS

International Search Report for PCT/US03/24110, Aug. 26, 2004.

(Continued)

*Primary Examiner*—Tan T. Nguyen
(74) *Attorney, Agent, or Firm*—Marger Johnson & McCollom, PC

(57) ABSTRACT

A ferroelectric memory comprises a plurality of memory cells and circuitry to sense data thereof. Power supply decoupling circuitry may decouple supplies of the memory device during a portion of reading data. Additionally, ferroelectric domains of the memory cells may receive a series of polarization reversals to improve domain alignment and malleability. To drive reference cells of the memory with such polarization reversals, a multiplexer may be configured to swap a data bitline with a reference bitline so that reference cells may be accessed as regular data cells. While reading a ferroelectric memory, a self-timer circuit may monitor characteristics of the ferroelectric material and adjust an integration duration for a sense amplifier based on the monitored characteristics. A sampling-comparator may sample a signal related to the ferroelectric material at one instant, which may then be used subsequently thereafter by the self-timer circuit to influence an integration duration of the sense amplifier.

9 Claims, 19 Drawing Sheets

U.S. PATENT DOCUMENTS

| | | | |
|---|---|---|---|
| 6,646,904 B1 * | 11/2003 | Chow | 365/145 |
| 6,888,737 B1 * | 5/2005 | Chow | 365/145 |
| 2001/0005326 A1 | 6/2001 | Braun | |
| 2002/0093847 A1 | 7/2002 | Tada | |

FOREIGN PATENT DOCUMENTS

| | | |
|---|---|---|
| EP | 0 986 066 A2 | 3/2000 |
| WO | WO 02/05287 A1 | 1/2002 |
| WO | WO 03/075279 A1 | 9/2003 |

OTHER PUBLICATIONS

Safari, Ahmad; Panda, K. Rajesh; Janas, Victor F.; "Ferroelectric Ceramics: Processing, Properties & Applications" (Dept. of Ceramic Science and Engineering, Rutgers University, Piscataway NJ 08855, USA) www.rci.rutgers.edu/~ecerg/projects/ferroelectric.html (50 pages).

Johns, David; Martin, Ken; (University of Toronto), "Analog Integrated Circuit Design," Chapter 7 Comparators, pp. 304-305, 312-313.

* cited by examiner

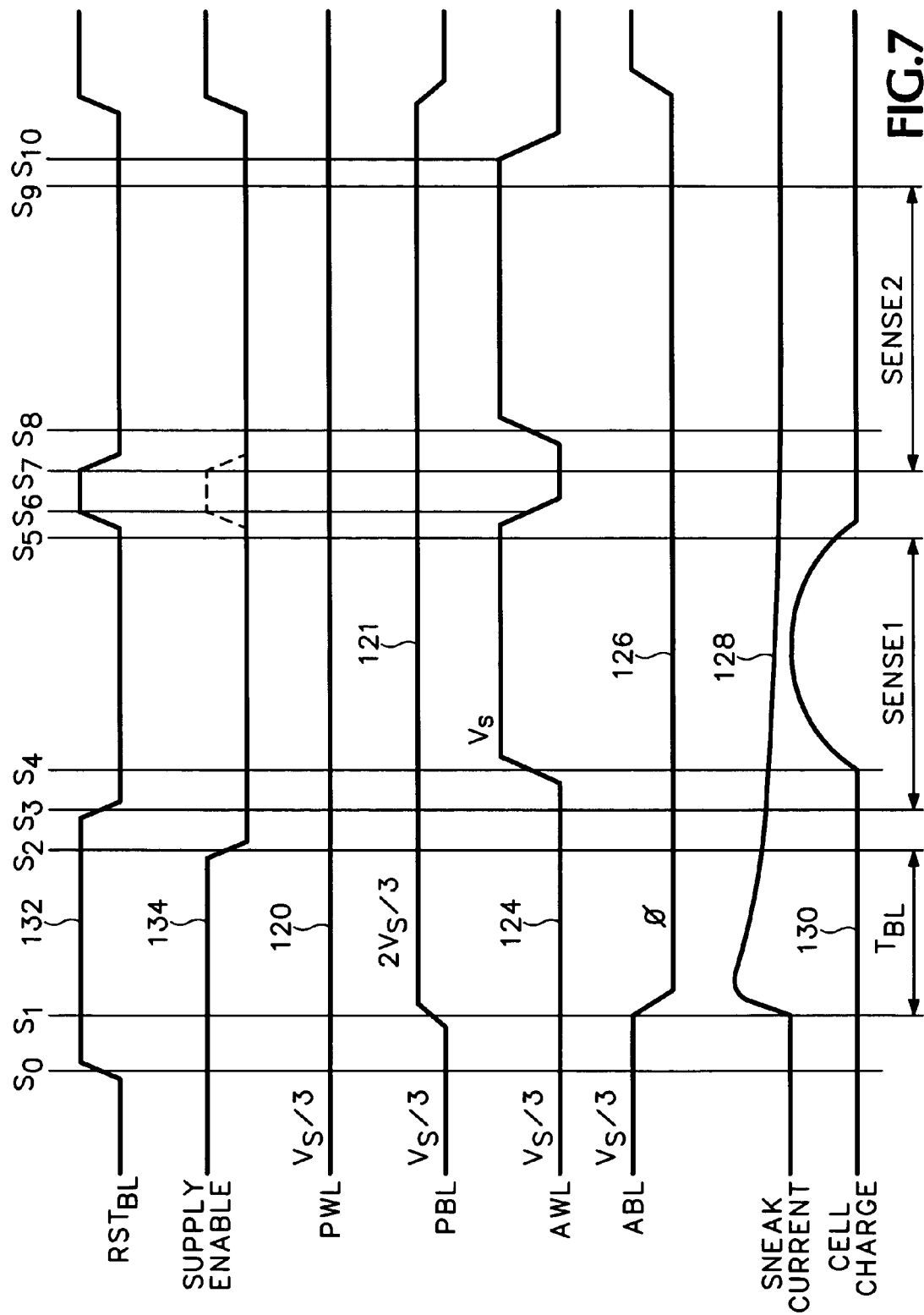

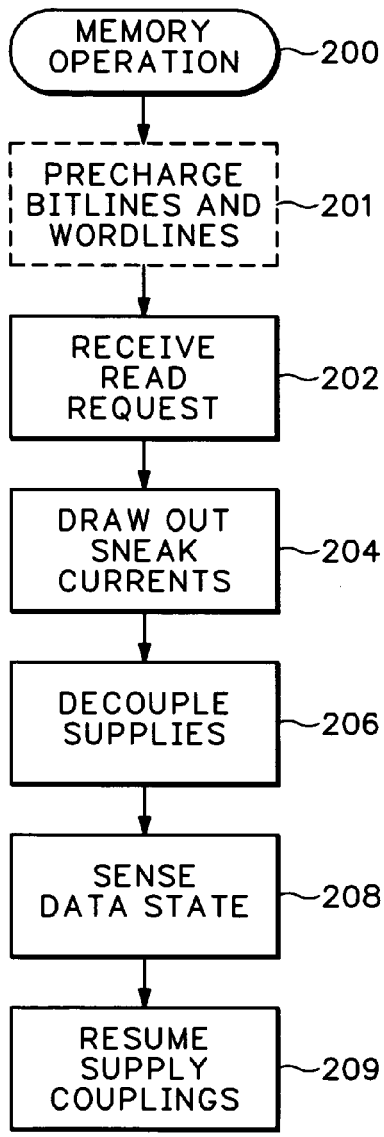
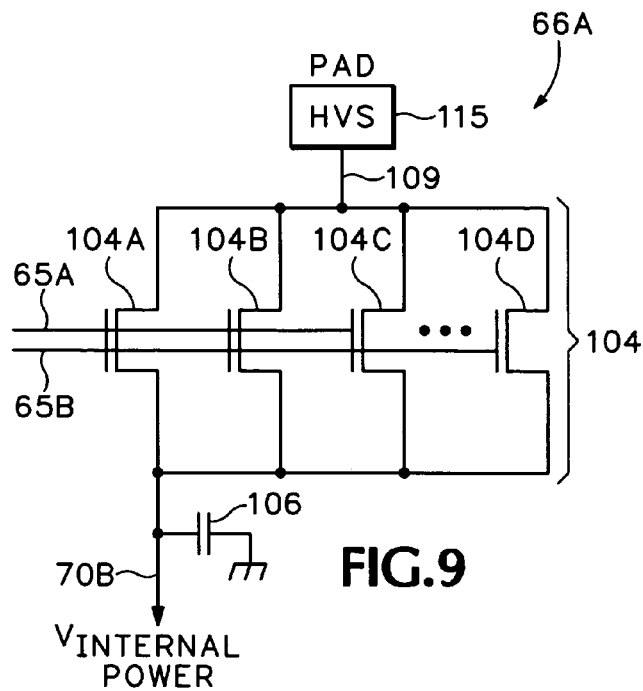
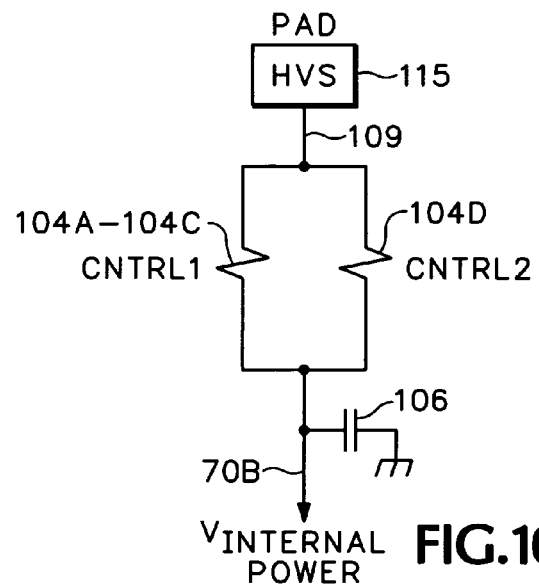

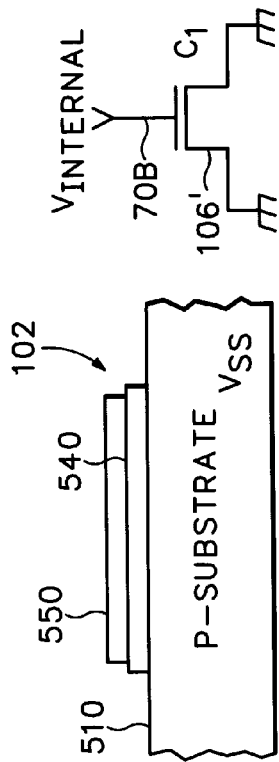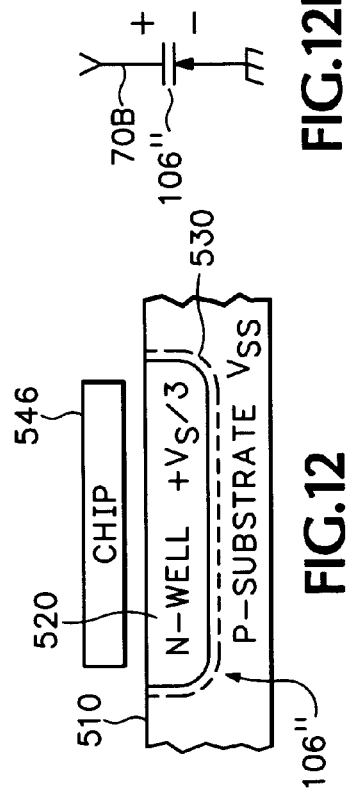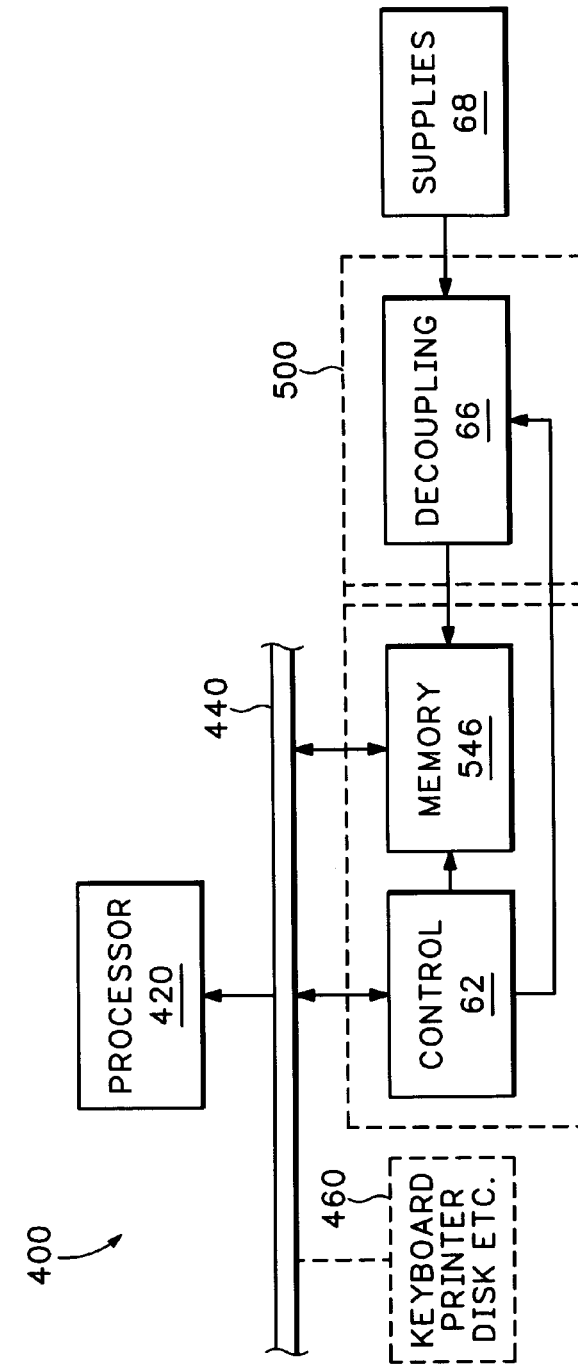

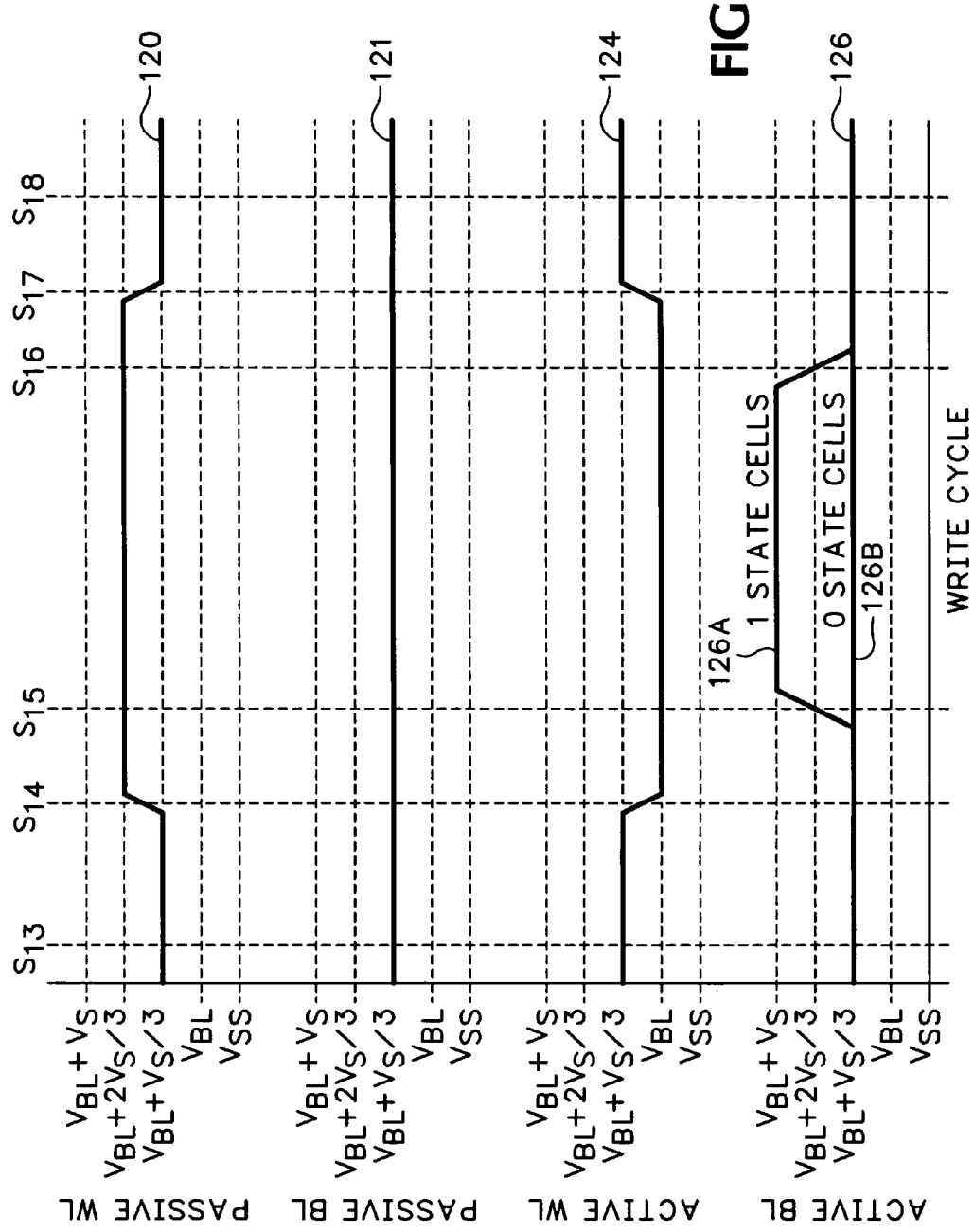

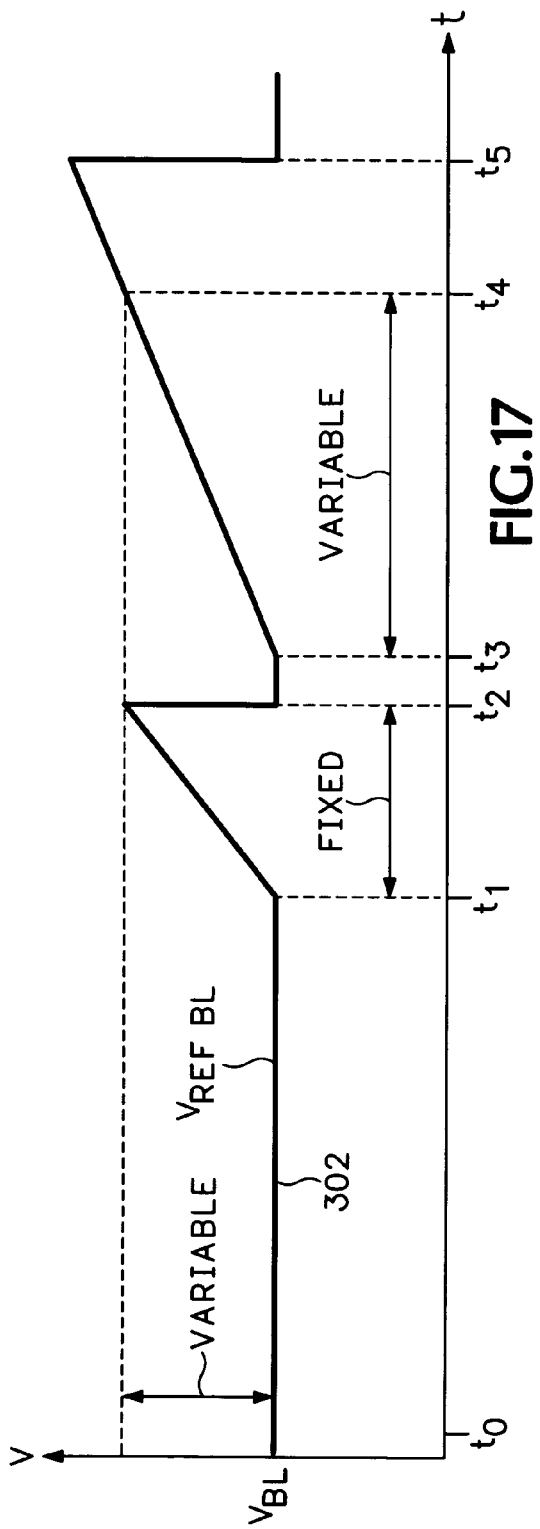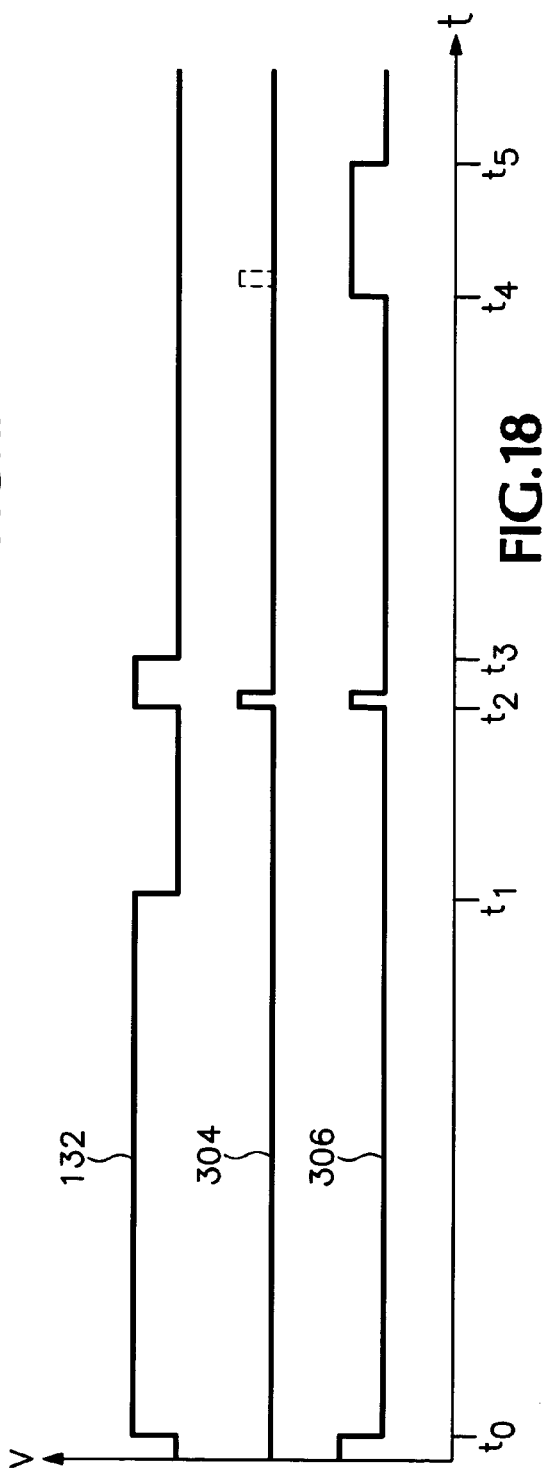

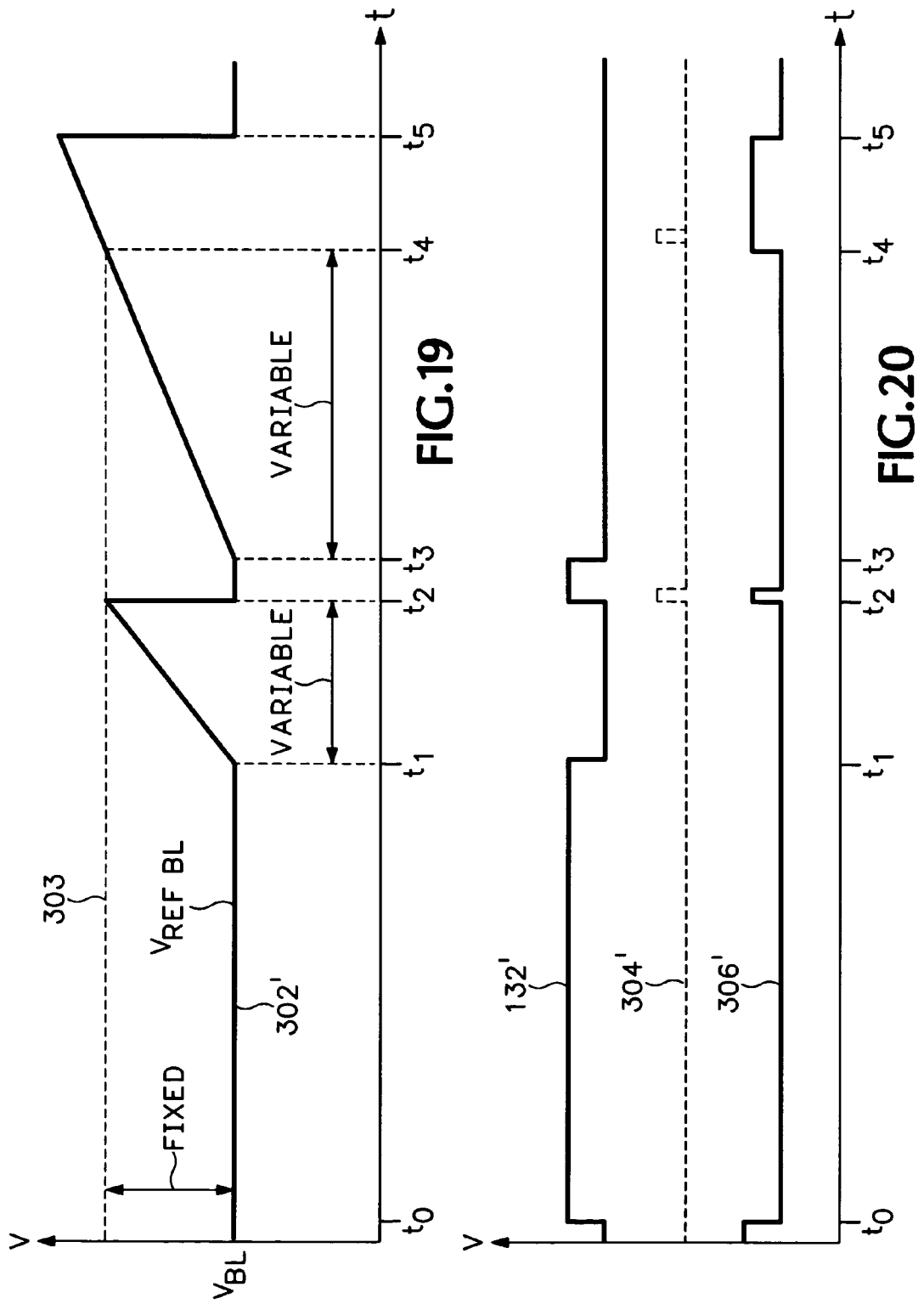

MEMORY DEVICE, CIRCUITS AND METHODS FOR OPERATING A MEMORY DEVICE

This application is a division of prior application Ser. No. 10/218,396 filed Aug. 14, 2002 now U.S. Pat. No. 6,920,060.

BACKGROUND OF THE INVENTION

Computer systems may employ a variety of memory, including, for example, magnetic disk and semiconductor memory systems. Typically, disk storage systems target large, low speed memory applications; whereas, semiconductor storage systems target high-speed, low capacity memory applications.

Exemplary semiconductor memory include dynamic random access memory (DRAM), static random access memory (SRAM), electrically programmable read only memory (EPROM), flash memory, and ferromagnetic semiconductor memory devices. Of these, the volatile devices, such as SRAM and DRAM may require continuous power for data retention. When power is removed from these volatile devices, data may be lost.

Unlike the volatile devices, nonvolatile memory may provide data retention in the absence of power. Exemplary nonvolatile memory include magneto-resistive, ferromagnetic and ferroelectric memory devices. Recently, some manufacturers of nonvolatile memory have been working to improve ferroelectric memory and their methods of operation and manufacture. Additionally, conditioning of ferroelectric material may improve reliability of ferroelectric memories.

BRIEF DESCRIPTION OF THE DRAWINGS

The present disclosure may be best understood with reference to the accompanying drawings, wherein:

FIG. 7 is a simplified timing diagram simplistically illustrating a sequence of signals during reading of a ferroelectric memory, in accordance with an embodiment of the present invention;

FIG. 8 is a flow chart schematically illustrating a method of reading ferroelectric memory in accordance with an exemplary embodiment of the present invention;

FIG. 9 is a simplified schematic of decoupling circuitry as may be associated with an exemplary embodiment of the present invention;

FIG. 10 is a schematic representation of the circuit of FIG. 9;

FIG. 12 is a partial, cross-sectional view taken from a region of FIG. 1, showing a memory chip over a decoupling capacitor that may be integrated within a region of a supporting substrate of a memory module in accordance with an embodiment of the present invention;

FIG. 12B provides a schematic representation of a capacitor as may be provided by an N-P junction under reverse bias;

FIG. 13 is a partial, cross-sectional view taken from a region of FIG. 11, showing a capacitor for a memory module as may be associated with exemplary embodiments of the present invention;

FIG. 13B shows a schematic representation of the capacitor of FIG. 13 as may be provided by a gate layer over a gate oxide integrated with a supporting substrate; and FIG. 14 is a block diagram schematically illustrating a data processing system comprising a memory module as may be associated with an exemplary embodiment of the present invention.

FIG. 15 is a simplified timing diagram simplistically illustrating a sequence of signals during writing of a ferroelectric memory to assist an understanding of embodiments of the present invention;

FIGS. 17–18 are timing diagrams showing a sequence of signals associated with sensing data of a ferroelectric memory in accordance with exemplary embodiments of the present invention;

FIGS. 19–20 are timing diagrams showing another sequence of signals associated with sensing data of a ferroelectric memory in accordance with exemplary embodiments of the present invention;

DETAILED DESCRIPTION

Ferroelectric Memory

Figure 1:
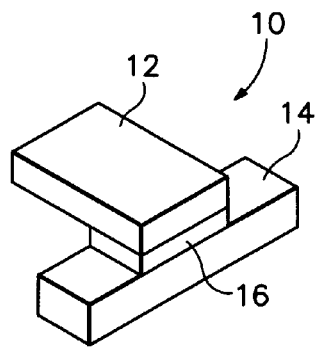
FIG. 1 is a partial cross-sectional and isometric view of a ferroelectric cell between a wordline and bitline.
Figure 2:
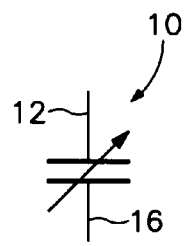
FIG. 2 is a simplified schematic of a ferroelectric cell.

Referencing FIGS. 1 and 2, an exemplary ferroelectric cell 10 comprises ferroelectric material 14 sandwiched between first and second electrodes, such as, for example, wordline 12 and bitline 16 of a known ferroelectric memory array. Such cell may be viewed or modeled as a variable capacitor, of capacitance value dependent upon the orientation or polarization of the domains of the ferroelectric material between the electrodes. A spontaneous polarization vector may characterize an alignment of domains of the ferroelectric material as influenced by an electric field. Upon removing the electric field, a remnant polarization may remain. Applying a switching-level electric field of opposite polarity can reverse or at least alter the polarization orientation.

For a ferroelectric memory cell, the polarization alignment may establish its stored data state. As illustrated by the polarization versus voltage hysteresis curve 20 of FIG. 3, "0" (zero) and "1" (one) storage state may be shown to correspond to remnant polarization states at the conditions 22,24 respectively, where the cell's hysteresis curve 20 crosses vertical axis 28. In operation, application of a negative voltage $-V_s$ to the ferroelectric cell may set the cell's polarization to a negative orientation (following path 34 of curve 20 to position 27) for establishing a "one" state. Upon removing the applied voltage, a negative remnant orientation may remain (path 36 to position 24). Thereafter, application of a positive voltage $V_s$ can reverse the cell's polarization state (path 30 to position 25), which "one" to "zero" polarization reversal may be accompanied by a charge release. In contrast, a cell of a zero state may not provide such magnitude charge release upon application of $V_s$ (path 32 to position 25). This difference in the amount of released charge between the "one" and "zero" states may provide the basis for storing data within and/or reading data of a ferroelectric cell i.e., applying a voltage to the cell for setting its polarization or monitoring the cell for released charge.

Figure 3:
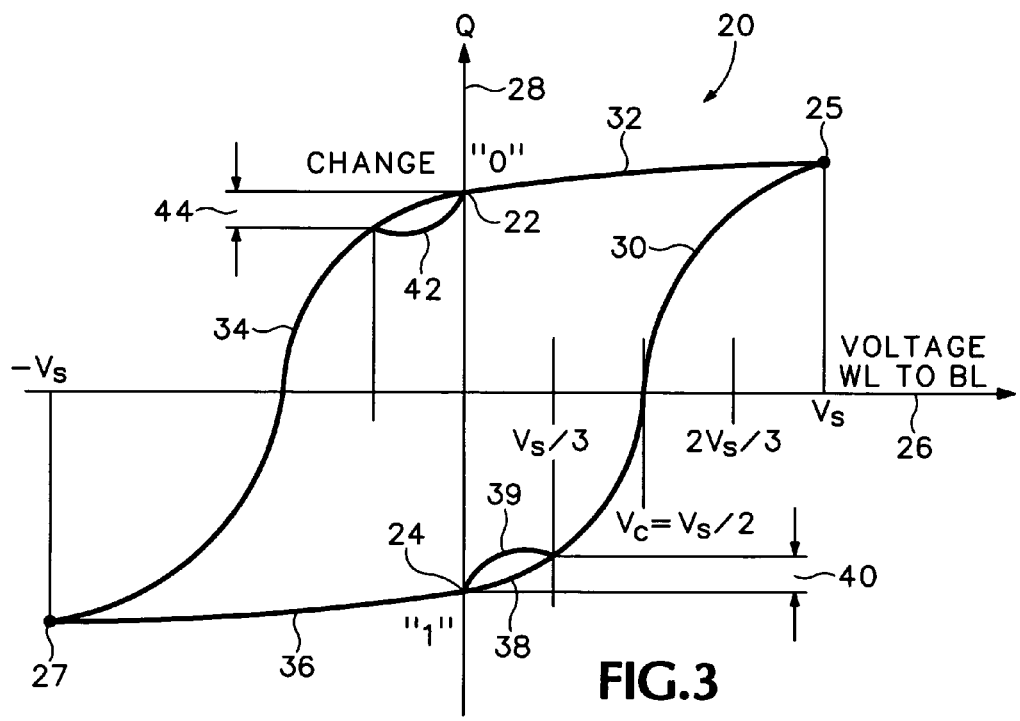
FIG. 3 is a graph simplistically illustrating a polarization-versus-voltage, hysteresis curve of a ferroelectric cell.

Further referencing FIG. 3, a ferroelectric cell may exhibit resilience, wherein the ferroelectric cell may restore a remnant polarization despite a small disturbance. For example, assuming a one state storage condition for a ferroelectric cell, as represented by the remnant polarization condition 24 of hysteresis curve 20, a small voltage disturbance of $V_s/3$ along path 38 may provide a small polarization shift 40, which in turn, may contribute a small charge release that may be termed a "sneak current." However, once the voltage disturbance is removed, polarization domains of the ferroelectric cell may substantially realign their orientations to that of the cell's overall orientation, i.e., as modeled by path 39 of hysteresis curve 20.

Ferroelectric Memory Array and Operation

Figure 4:
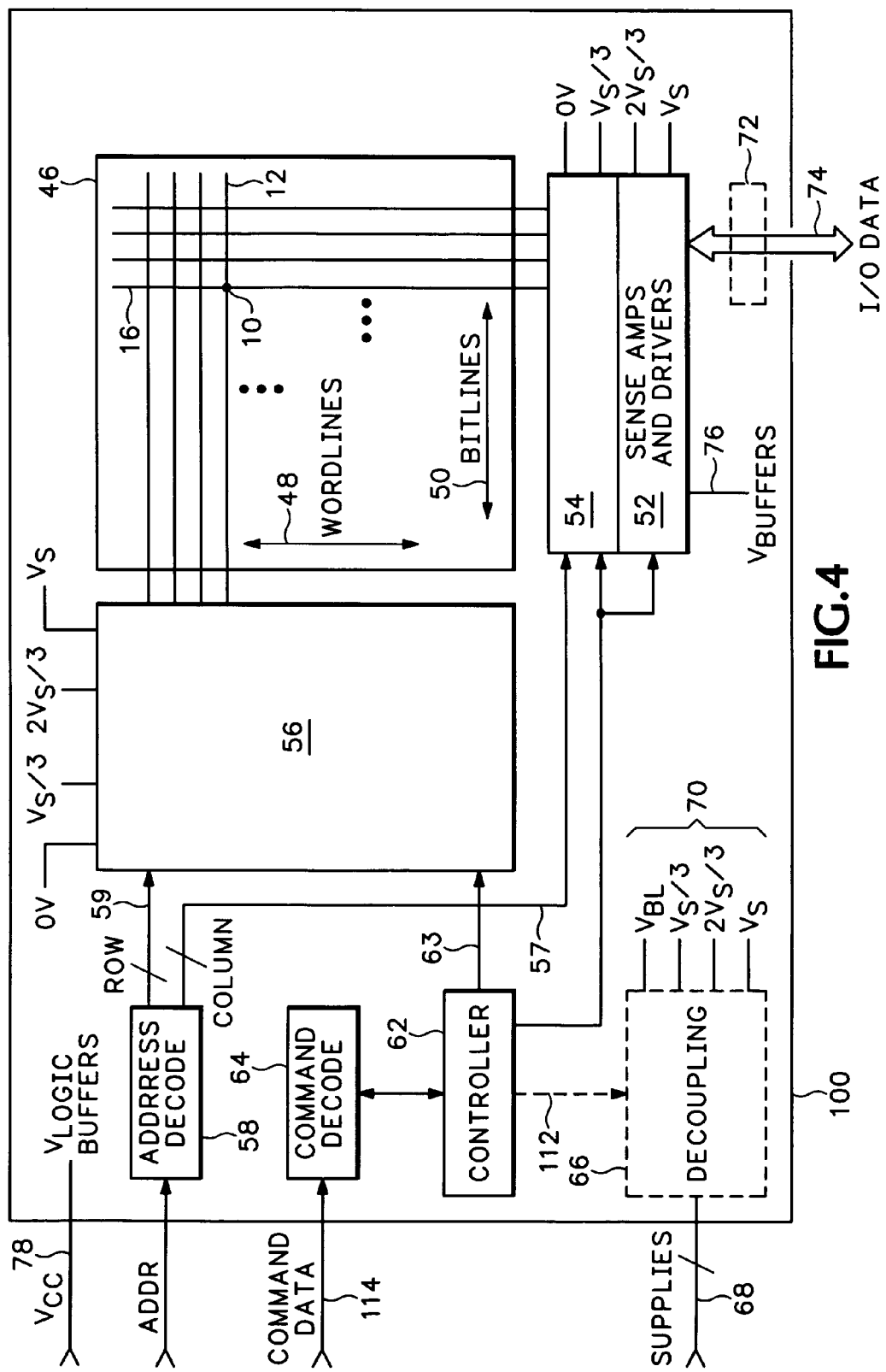
FIG. 4 is a simplified block diagram of a ferroelectric memory in accordance with an embodiment of the present invention.

With reference to FIG. 4, a simplistically illustrated ferroelectric memory array 46, for an exemplary embodiment of the present invention, may be formed with a plurality of wordlines 48 that overlap a plurality of bitlines 50. Ferroelectric material may be formed between the wordlines and the bitlines, establishing ferroelectric cells between the wordlines and the bitlines. For example, active ferroelectric cell 10 may be located at the crossing of active wordline 12 and active bitline 16. Reference bitlines (RBL) may also be formed amongst the bitlines within the array 46 to assist reading of selected, active ferroelectric cells 10, as will be explained more fully subsequently herein.

The term "active" may describe a cell selected to be read, and also distinguishes the particular wordline (AWL) and bitline (ABL) that may be coupled to the active ferroelectric cell. Non-active wordlines and bitlines may be described as passive wordlines (PWL) and passive bitlines (PBL) respectively.

When reading an active cell, a read level voltage may be applied to the active wordline 12. The read level voltage may comprise a magnitude that is defined relative to the active bitline 16, and sufficient to effect a polarization state and/or reversal of the active cell 10. It will be noted that reading of the active cell may be destructive, wherein application of the read level voltage may switch the cell's polarization state and may have the effect of writing the cell with opposite data. Accordingly, after rendering a cell, it may be desirable to rewrite the data by writing the data back into the active cell. During normal operations, the passive bitlines and passive wordlines typically may receive quiescent-level voltages that establish quiescent-level electric fields across their respective passive ferroelectric cells during the read operation.

For purposes of describing the present invention, the quiescent levels may be defined in accordance with the resilient qualities of the ferroelectric cell, wherein a polarization disturbance or bias of a cell may be kept within the cell's recovery range. For example, in accordance with one exemplary embodiment of the present invention, the quiescent levels for potentials across a ferroelectric cell may be kept within a magnitude less than ⅓ the cell's saturation level (e.g., less than one-third $V_s$).

Continuing with reference to FIG. 4, sense amplifiers & drivers 52 (disclosed in greater detail subsequently herein) may be coupled to selected active bitlines 16 by way of bitline multiplexer & bias circuitry 54. When enabled, the sense amplifiers may sense the released charge of selected memory cells 10 as propagated by the active bitlines 16. Again, the selected memory cells may receive read-level biasing via the voltage level of the active wordline (AWL) 12 as defined relative to that of the active bitline (ABL) 16. Wordline multiplexer & bias circuitry 56 may select, in accordance with addressing 59 received from address decode 58, an active wordline 12 to receive the read level voltage, and the circuitry 56 may also provide quiescent-level voltages to other passive wordlines. For example, during such read operation, the active wordline 12 may receive a read level voltage $V_s$ and the passive wordlines may receive a quiescent level voltage, e.g., $V_s/3$.

In accordance with a particular, exemplary embodiment of the present invention, the ferroelectric material of the ferroelectric cell comprises a polymer type ferroelectric of several nanometers thickness. For such exemplary material and thickness, the saturation level voltage $V_s$ of the ferroelectric cell may be several volts, such as, e.g., as large as approximately 18 volts. However, it is understood that the scope of the present invention may encompass other ferroelectric materials and/or thicknesses, and, likewise, alternative saturation levels as may be determined for the alternative ferroelectric materials and or thicknesses.

In this embodiment, bitline multiplexer & bias circuit 54 may select, per addressing 57 of address decode 58, which ones of the bitlines to couple as the active bitlines 16 to sense amplifiers & drivers 52 while biasing the other passive bitlines with quiescent level voltages, e.g., Vs/3 and 2Vs/3. Responsive to command decode 64, controller 62 may control the sequence of the operations of sense amplifiers 52, bitline multiplexer and bias circuits 54 and wordline multiplexer and bias circuit 56 to enable the sense amplifiers to sense charge during read-level activations of active wordline 12 and to enable the other circuits to apply the read and quiescent level voltages to the wordlines and bitlines during the read operation. Controller 162 may be further operative to control timing of the write drivers (of sense amplifier write drivers 52) and the bitline multiplexer-bias circuit 54 and wordline multiplexer & bias circuit 56 to rewrite, e.g., "one" states back into the cells as needed following a destructive read. These sequences will be described more fully subsequently herein with reference to FIGS. 7 and 8.

Additionally, in accordance with certain embodiments of the present invention, controller 62 may provide control signals to decoupling-circuits 66 that may allow isolation of internal supply nodes 70 from external power supplies 68 when the sense amplifiers may be sensing currents of the active bitlines as a part of determining released charge of a select cell.

Further referencing FIG. 4, node 78 receives a logic voltage Vcc to power logic circuits such as, for example, address decode 58, controller 62, command decode 64 and optional I/O data-latch & multiplexer 72. Optional I/O data-latch & multiplexer 72 may capture data from sense amplifiers that may be held for subsequent retrieval. For example, if the bit-width of the internal data bus 74 is wider than that of an external data bus, then the I/O multiplexer may, over time, multiplex the latched data to the narrower bit-width of the external data bus.

The sense amplifier & drivers 52, in accordance with one exemplary embodiment, may receive power from a voltage source 76, e.g., $V_{buffer}$, separate from the internal decoupled supply nodes 70. Accordingly, during a read operation, power from internal supply nodes 70 may meet the low current demands of the memory device during a read operation, while the other voltage source 76, e.g., $V_{buffer}$, may meet the larger current demands of the memory device during the read operation, such as, for example, powering sense amplifiers 52.

Additionally, assuming supply rejection capability for the amplifiers of the buffer and sense amplifiers, such circuitry may therefore be able to tolerate certain noise levels within their supplies without having the noise directly impact the signal processes of their respective buffer and integrating operations.

In accordance with another exemplary embodiment, the amplifiers of the sense amps and drivers 52 may receive power from the logic voltage supply of voltage $V_{cc}$, e.g., node 78 of FIG. 4. This may be effective, assuming the amplifier applications may keep the amplifier output voltages below the $V_{cc}$ voltage level.

Figure 5A:
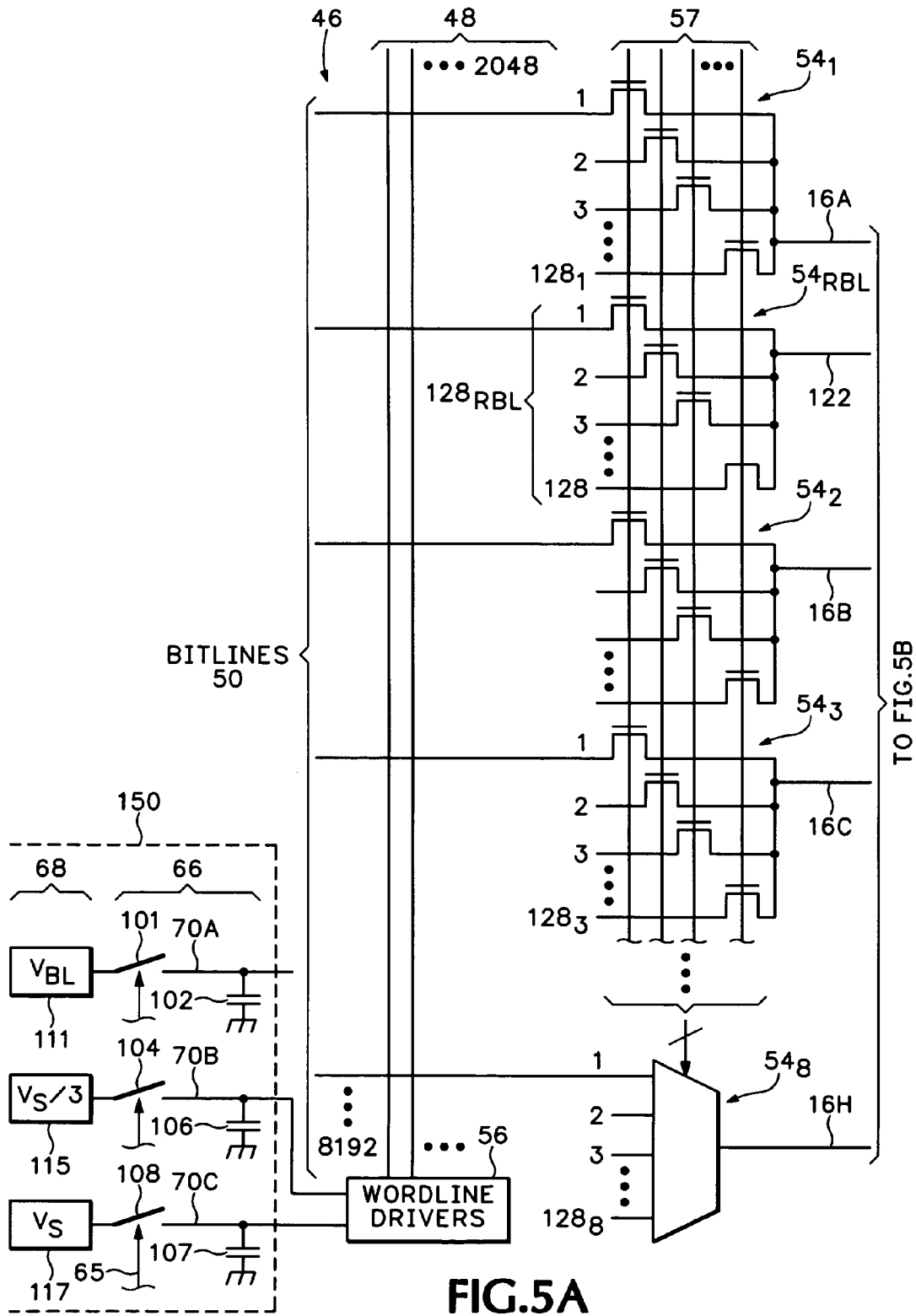
FIGS. 5A–5B provide a simplified schematic diagram for a portion of a ferroelectric memory showing bitlines, sense amplifiers, a buffer and multiplexers to interface the bitlines to the sense amplifiers and buffer in accordance with another embodiment of the present invention.
Figure 5B:
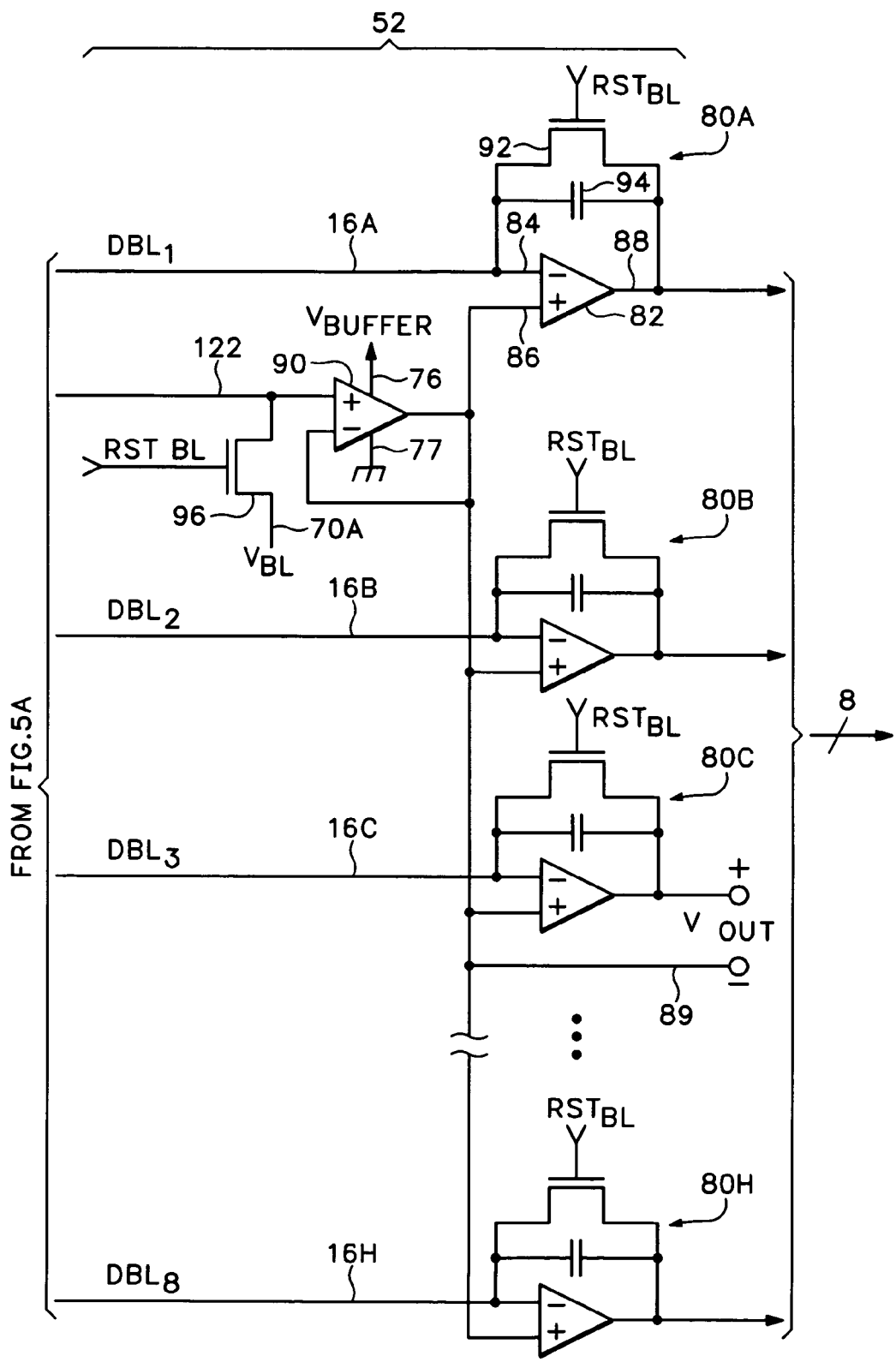

In greater detail, with reference to FIGS. 5A–5B, sense amplifiers & drivers 52 may comprise a plurality of integration sense amplifiers 80A,80B,80C . . . 80H. Each integration sense amplifier may comprise a differential amplifier 82 having its inverting-input 84 coupled to receive a signal from an active bitline 16 and its non-inverting input 86 coupled to receive a reference signal from the output of voltage-follower or buffer 90, which typically buffers a signal of reference bitline 122. Switch 92 may provide a selective bi-pass for shorting and clearing integration capacitors 94 of respective sense amplifier driver 80. In operation, the MOSFET, pass-gate or switch 92 (or equivalent thereof) may receive a control signal $RST_{BL}$ to enable clearance or reset of the integration amplifier's integrated value.

Another switch 96 MOSFET or pass-gate or the like, may be coupled between the reference bitline 122 and a reference bitline voltage source $V_{BL}$—previously described alternatively herein as an offset voltage. When enabled by control signal $RST_{BL}$ for the reference bitline reset, MOSFET 96 may allow biasing of reference bitline 122 from the source of the bitline reference voltage $V_{BL}$. In accordance with an exemplary embodiment of the present invention, various alternative voltage levels (e.g., $V_s$, $V_s/3$ not shown in FIG. 5B) can be selectively applied to the reference bitline during conditioning or testing of the reference cells of the reference bitlines.

Bitline Multiplexing

Further referencing the simplified schematic diagram of FIGS. 5A–5B, multiplexer & bias circuitry 57 may comprise eight different multiplexers $54_1$, $54_2$, . . . $54_8$ of selection ratios 1 of 128. Such multiplexers establish the select bitlines 16A, 16B, . . . 16H from amongst their respective pluralities $128_1$, $128_2$ . . . $128_8$ that may be coupled to their sense-amplifiers/drivers 80. Additionally, in this embodiment, reference bitline multiplexer $54_{RBL}$ may comprise a selection ratio 1 of 128 similar to that of the multiplexers 54 that interface the data bitlines to the sense amplifiers. But instead, the reference multiplexer $54_{RBL}$ interfaces the group of reference bitlines $128_{RBL}$ to buffer 90. In this embodiment, the combination of circuits of, e.g., the reference bitlines $128_{RBL}$, reference multiplexers $54_{RBL}$ and buffers 90 may be distributed at various locations across the ferroelectric memory array 46 amongst the data bitlines 50. In accordance with a particular exemplary embodiment of the present invention, the circuits of the reference bitline group $128_{RBL}$ and multiplexer $54_{RBL}$ may be positioned near the middle of their associated data bitline groups 128.

In a particular example, reference multiplexer $54_{RBL}$ may select a given reference bitline 122 that may be coupled to buffer 90. Buffer 90 may buffer the signal of the reference bitline to be used to drive the reference inputs, e.g., the positive input terminals 86, of amplifiers 82 of the multiple integration sense amplifiers 80. The output of buffer 90 may fan-out to provide buffered reference levels to a number of the sense amplifiers 80. The number, e.g., eight, of sense amplifiers 80 driven by the reference bitline buffer 90 may correspond to the number of different groups of data bitlines 128[1:8] to be associated with a given group of reference bitlines $128_{RBL}$. Although eight groups of data bitlines $128_1$–$128_8$ are shown in FIGS. 5A–5B to be associated with one group of reference bitlines $128_{RBL}$, it is understood that alternative number of data bitline groups may be provided per reference bitline group—e.g., 64 groups of data bitlines might be provided per grouping of reference bitlines.

With buffers 90, the capacitive loading of the reference bitline may be kept small and similar to that of the respective data bitlines. Further referencing FIG. 5B, a select reference bitline may have a capacitance load comprising the capacitance of line 122 to buffer 90 and the input capacitance of the buffer. Without buffer 90, the charge or signal propagated by the reference bitline might otherwise be diluted by the aggregated capacitance of the input terminals of the plurality of sense amplifiers 80.

In the exemplary embodiment of FIGS. 5A and 5B, each group of bitlines is disclosed with 128 bitlines. It is understood that the scope of the present invention will encompass other number—e.g., 32, 64, 256 . . . —of bitlines per group, and that the multiplexers, likewise, may provide corresponding selection ratios—e.g., 32:1, 64:1, 256:1 . . . respectively.

Figure 6:
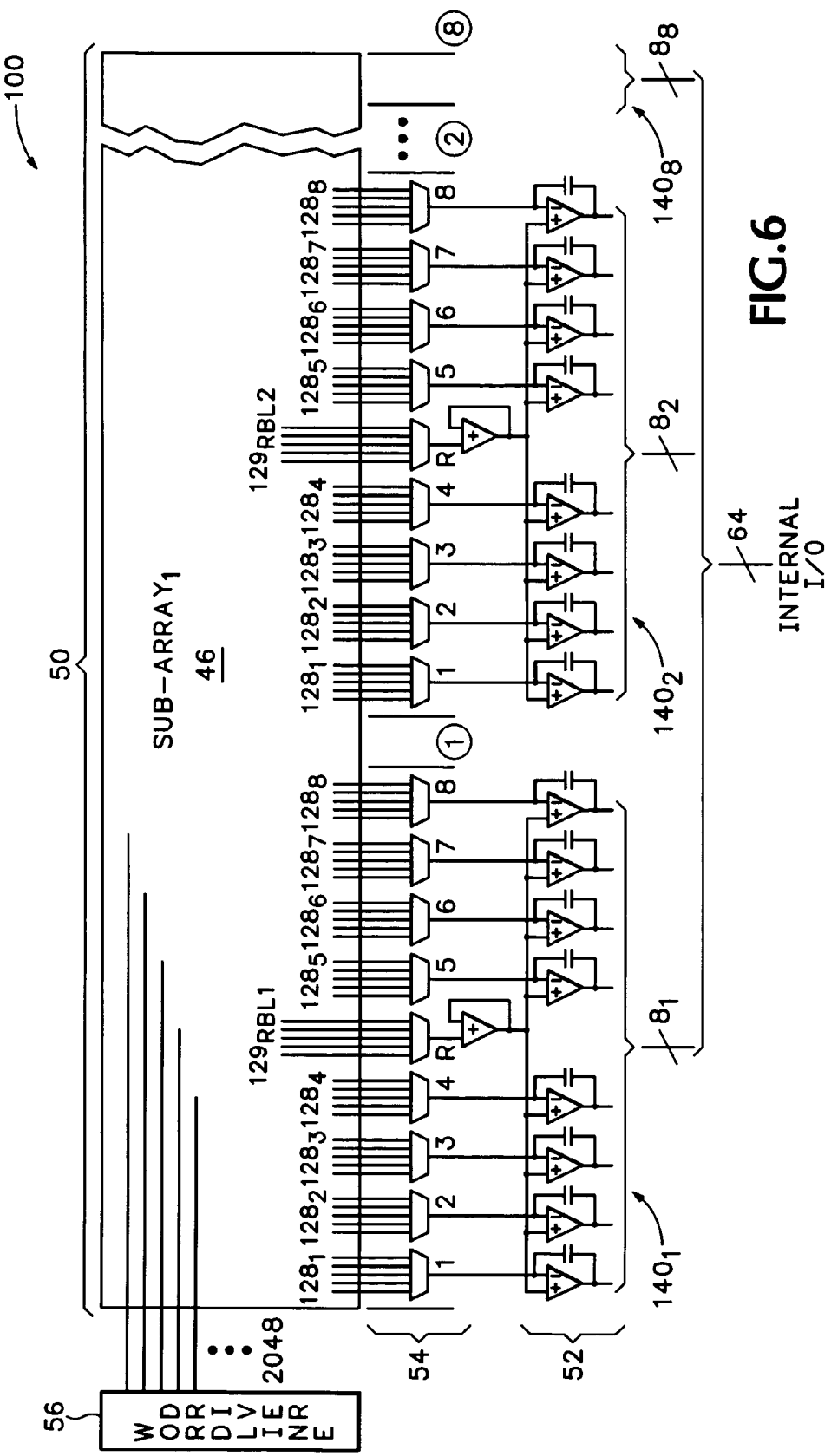
FIG. 6 is a simplified schematic diagram of a portion of a ferroelectric memory showing reference bitlines distributed amongst data bitlines in accordance with a further embodiment of the present invention.

Referencing FIG. 6, the groups of the reference bitlines $128_{RBL}$ in this exemplary embodiment may be positioned near the middle of their data bitline groups. For a particular exemplary embodiment, the reference bitlines may be disposed between the fourth $128_4$ and fifth $128_5$ groups of the associated eight groups of data bitlines (FIG. 6). With the reference bitlines in the middle, the distance that the reference signal has to propagated from the buffer of the reference signal to the plurality of sense amplifiers 80 may be reduced. In alternative embodiments of the present invention, the reference bitline groups may be positioned away from the middle of the data bitline groups. For example, as illustrated in FIGS. 5A–5B, a group of reference bitlines 128$_{RBL}$ may be located between the first 128$_1$ and second 128$_2$ data bitline groups of the eight different data bitline groups.

Again, further referencing FIGS. 4–5, multiplexer & bias circuitry 57 may establish the selection of active data bitlines 16 and active reference bitline 122 from amongst their respective groups of available data and reference bitlines. The multiplexer portions 54$_1$, 54$_2$, ... 54$_8$, 54$_{RBL}$ as shown in FIGS. 5A–5B, may couple the selected data bitlines to their sense amplifiers 80 and the selected reference bitline to buffer 90. Not shown, however, are additional bias circuit portions that may couple the non-selected data and reference passive bitlines (PBLs) to receive a quiescent level voltage, e.g. 2Vs/3, as may be desired during a read operation.

Additionally, in accordance with a further aspect of an exemplary embodiment of the present invention, each of the multiplexers 54 (as shown in FIGS. 5A–5B) may comprise two stages of multiplexing. For the exemplary embodiment of FIG. 5, a select MOSFET of a given multiplexer 54 may couple a select bitline to the data input 16 of its sense amplifier 80. But for this embodiment, the select bitline sees a load that includes the source/drain regions of the other MOSFETs of the multiplexer 54. This loading from the source/drain regions of the other MOSFETs may be termed "diffusion loading."

To reduce the diffusion loading presented to a selected bitline, in accordance with another embodiment, multiplexer 54 may be configured to compromise two different stages (not shown) of multiplexing. For example, a first stage may comprise four multiplexers of selection ratio 32:1 that may select four bitlines of the 128 bitlines. A second stage comprises a multiplexer of a 4:1 ratio that may select a final bitline from amongst the four of the first portion to provide an equivalent, or overall multiplexer selection ratio of 128:1. With this two stage multiplexer selection, the diffusion loading of a selected bitline may be reduced from the 127 source/drain diffusion regions to only 34—i.e., 31 diffusion regions of the MOSFETs of the first stage multiplexer plus the 3 other diffusion regions of the MOSFETs of the second stage multiplexer.

To interface the bitlines of the array of ferroelectric cells 46 of memory device 100, referencing FIGS. 5A–5B and 6, the exemplary circuits of multiplexers 54, sense amplifier/drivers 80 and buffers 90 may be patterned repetitively across the width of an array of ferroelectric memory 46. For example, eight repetitions 140$_1$, 140$_2$ ... 140$_8$ of the multiplexers 54, sense amplifier/drivers 80 and buffers 90 may selectively interface addressed bitlines of the available 8,000 bitlines. These circuits, likewise, may select which of the 8 k may be used to communicate with the lines of the internal bus, for example, of a 64-bit width. It is noted that for the particular exemplary embodiment illustrated in FIG. 6, the various reference bitline groups, for example, 128$_{RBL}$, that are distributed across the array 46 may be centered amongst their respective groups of data bitlines—i.e., between data bitline groups 128$_4$ and 128$_5$. However, and again, for alternative embodiments, the circuitry of the reference bitlines may be offset from the centers of the respective data bitline groups. Further, various alternative numbers of bitlines, internal I/O widths and interfacing circuit ratios might be used for such alternative embodiments.

As will be described more fully below, in accordance with an exemplary embodiment of the present invention, samplers and comparators may follow each of the sense amplifiers 80 to assist determination of data of the selected data bitlines. When reading data of a select bitline, a first sample of an integrated signal of the bitline may be compared to a second for the determination of data values.

Further Operation

Further referencing FIGS. 4, 5A and 5B, the wordline multiplexer-bias circuitry 56 may determine, per row addressing 59 of address decode 58, which of the plurality of wordlines 48 will be an active wordline. During a read operation, sequenced by controller 62, wordline multiplexer-bias circuitry 56 may couple the active wordline to receive a read level voltage Vs. The other wordlines may be coupled as passive wordlines to receive a quiescent level voltage Vs/3. But because the external supplies 68 may include extraneous noise (e.g., switching supply noise, electromagnetic interference, etc) that might adversely impact the read operation of sense amplifiers 80, an exemplary embodiment provides decoupling circuits 66 that may provide selectable isolation of the external supplies 68 during sense operations of sense amplifiers 80.

In accordance with this embodiment with reference to FIG. 5A, decoupling circuitry 66 may comprise switches 101,104,108 disposed in series with internal supply lines of respective supplies, e.g., of voltages $V_{BL}$, $V_s/3$, and $V_s$ respectively. Capacitors 102,106,110 may be coupled to the internal nodes 70A,70B,70C of the supplies $V_{BL}$, $V_s/3$, and $V_s$ to filter noise. Additionally, the capacitors may provide temporary supply reserves when the switches may be opened during certain operations of the memory device. Supply cut-off control signals 112 from controller 62 may control and determine the configurations of switches 101, 104,108.

With reference to FIGS. 4–8, in accordance with an exemplary embodiment and operation (block 200 of FIG. 8) of memory device 100, the bitlines and wordlines 50,48 (FIGS. 4–6) begin with substantially the same voltage levels, e.g., $V_s/3$ for signals 120,121,124,126 of FIG. 7 at time $S_0$ (block 201 of FIG. 8). With the wordlines and bitlines at similar bias levels, each ferroelectric cell of the ferroelectric array 46 may experience a quiescent potential of about 0 volts. Under this steady state condition, the ferroelectric memory cells may retain their storage states.

Further referencing FIG. 7, wordline and bitline signals 120,121,124,126, typically comprise an offset, for example, such as a bitline reference or offset voltage $V_{BL}$. For purposes of simplifying some of the disclosure herein, the wordline and bitline signals may be described assuming a bitline offset voltage $V_{BL}$ of 0 volts; however, it will be understood that the present disclosure may encompass various $V_{BL}$ offset levels. Such offset voltage may allow the amplifiers 82 of sense amplifiers 80A,80B,80C ... 80H of FIGS. 5A–5B to operate with their input terminals 84,86 biased above their negative voltage supply, e.g., of zero volts. Accordingly, the amplifier inputs may avoid saturation or compression. Additionally, the amplifiers may be maintained within a linear region of their dynamic range to assist rejection of noise that may reside on the amplifier supplies.

Returning briefly to FIG. 4, command decode circuit 64 receives command data at input 114 for directing operations of controller 62. Controller 62, upon receiving a read request (block 202 of FIG. 8), may coordinate a sequence of operations of row multiplexer & bias circuitry 56, bitline multiplexer & bias circuitry 54, sense amps and drivers 52 and decoupling circuitry 66 for determining data of select ferroelectric cells of the memory array 46.

Further referencing FIGS. 4–7, upon receiving the read request, the controller may send a reset signal $RST_{BL}$ to switches 92,96 (FIGS. 5A–5B) in order to bias the bitlines 16,122 with a reference voltage $V_{BL}$. The biasing of the bitlines may be provided via MOSFET 96 and buffer 90 and amplifiers 80A,80B,80C . . . 80H. Upon activation of reset signal $RST_{BL}$ 132 at time interval S1 (FIG. 7), MOSFETs 92 of the sense amplifiers 80 may short the plates of their respective integration capacitors 94, i.e., thereby balancing charge across the capacitor plates to eliminate previous charge accumulations. Additionally, with the MOSFETs 92 shorting capacitors 94, each of the sense amplifiers 80 may serve as a voltage follower (with its output 88 shorted to its inverting input 84) to drive selected bitlines 16. In other words, amplifier 82 of the reconfigured sense amplifier 80A may drive bitline 16A and establish a $V_{BL}$ bias level substantially corresponding to that presented by buffer 90 to the positive input 86. Likewise, the amplifiers 82 of the other configured voltage followers 80B,80C . . . may drive respective bitlines 16B,16C . . . to establish their $V_{BL}$ bias levels.

Further referencing FIGS. 5A–5B, as noted earlier herein, multiplexer $54_{RBL}$ may select one of the plurality of reference bitlines $128_{RBL}$ to be coupled to buffer 90. Multiplexer $54_{RBL}$ may receive the same column-select control signals 57 that are used for establishing selections of the multiplexers 54 interfacing the data bitlines. Having bitline arrangements and selections that may be the same as those of the data bitlines, the reference bitlines in accordance with exemplary embodiments of the present invention may receive biasing similar to the data bitlines. Accordingly, the cells of the reference bitlines may age and fatigue substantially the same as the data cells of the data bitlines. The reference cells and data cells, therefore, may maintain substantially equivalent ferroelectric hysteresis characteristics through a lifespan of the ferroelectric memory device 100.

As shown in FIGS. 5A and 5B, MOSFET 96 may be coupled to a select reference bitline downstream of a multiplexer $54_{RBL}$. Accordingly, the supply of the reference voltage $V_{BL}$ need only charge/discharge a single, select bitline selected by the multiplexer. Likewise, during a sense or read operation capacitor 102—on the memory side of switch 100 associated with the bitline reference voltage $V_{BL}$—may be sized to provide a power reserve sufficient to substantially meet the charge-equilibration or reset needs of the reference bitline during a reset duration of a dual read process, which will be addressed more fully below. In accordance with exemplary embodiments, the capacitor may be sized to several nanofarads, such as, e.g., up to 50 nF, and more typically approximately 1 to 10 nF.

Continuing the first stage of the read cycle in this embodiment, the voltage level of the active bitline signal 126 may drop to 0 (i.e., relative to $V_{BL}$) and the voltage level of the passive bitline signal 121 may be set to $2V_s/3$ at time $S_1$ in FIG. 7. The ferroelectric cells between the wordlines 48 and active bitlines 16 (FIG. 4–5) may experience a voltage potential of $V_s/3$, while the ferroelectric cells between the wordlines and the passive bitlines may experience a voltage potential of $-V_s/3$. Accordingly, cells of "0" state conditions between the wordlines and passive bitlines may experience slight polarization shifts 44 (FIG. 3) while cells of "1" state conditions that may be associated with the active bitline may experience a polarization shift 40, as represented by path 38 of the hysteresis curve 20 of FIG. 3.

For the ferroelectric cells coupled to the active bitline, in accordance with a particular exemplary embodiment, a residual charge release of, e.g., approximately 0.08 femtocoulombs per micrometer square, per one state memory cell, may be expected for propagation to the active bitline. Assuming, for example, that 2048 ferroelectric cells of 1 $\mu m^2$ may be coupled to the active bitline and a worst case condition of each cell having a one state condition, then the combined "charge" propagated to the active bitline may be as large as several femto-coulombs. Therefore, referencing FIGS. 7 and 8, the method of reading may begin with a bitline settling duration $T_{BL}$ between times $S_1$ and $S_2$, in order to draw residual charge (204 of FIG. 8) from the selected active bitlines 16A,16B,16C . . . (FIGS. 5A–5B) and to stabilize "sneak currents" 128 of the active bitlines, before trying to determine the state of active cells 10.

In accordance with a particular exemplary embodiment of the present invention, referencing FIG. 7, the sneak current signal 128 may decay over a bitline settling duration $T_{BL}$ of several microseconds. Accordingly, several microseconds may be provided between times S1 and S2 before starting sense intervals of a read cycle. Although, several microseconds is described for an exemplary embodiment of ferroelectric cells comprising several nanometers thick polymer-type ferroelectric material; alternative embodiments may establish alternative bitline settling durations in accordance with the switching characteristics of the given ferroelectric material and thicknesses. For such exemplary alternative embodiments of the present invention, the bitline settling may last a duration τ that may extend beyond a rapid transition region of the ferroelectric settling characteristic. For such embodiments, the sneak current may reach a substantially linear region of its characteristic settling curve.

During the bitline settling duration $T_{BL}$, i.e., the interval between snap-shot times S1 and S2 as shown in FIG. 7, each supply access switch 101,104,108 (FIG. 5A) may be closed and the supplies may charge/discharge the bitlines and wordlines (block 201 of FIG. 8) as the passive bitlines transition to $2V_s/3$ and the active bitline transitions to 0.

Again, it is noted that the supplies $V_s$, $2V_s/3$, $V_s/3$ and 0 may be defined relative to an offset voltage $V_{BL}$ such as, e.g., 2 volts. Accordingly, each supply may comprise such offset. For example, the $V_s$ supply may be equal to 18+2=20 volts, the $2V_s/3$ supply equal to 14 volts, the $V_s/3$ supply equal to 8 volts and the 0 supply equal to 2 volts.

Further referencing FIGS. 4–8, after the bitline settling duration $T_{BL}$, at time S2, external supplies 68 may be decoupled (block 226 of FIG. 8) or isolated from internal supply nodes 70 (FIG. 7). In accordance with an exemplary embodiment of the present invention, controller 62 may send a transition of the supply enable signal 134 (FIG. 6) to decoupling circuitry 66, which may then respond by decoupling the external supplies, e.g., Vs/3, from the internal supply nodes.

Supply Decoupling During Read Operation

In accordance with an embodiment of the present invention, the decoupling circuitry 66 may be part of memory device 100, or part of an integrated memory module. Alternatively, as represented by the dashed lines of FIG. 5A, the decoupling circuitry 66 may be remote from memory device 100 and may comprise part of an external supply sub-system 150 that is responsive to controller 62.

Relative to FIG. 4, ferroelectric cells may be disposed between crossings of wordlines 48 and active bitline 16 and may form ferroelectric capacitors. The capacitors of the passive cells, e.g., 2047 passive cells, capacitively couple the active bitline to the plurality of passive wordlines. As a result, absent the exemplary supply decoupling embodiments of the present invention, noise that may be carried by a supply for biasing the memory device, e.g., Vs/3 for biasing the passive wordlines, might otherwise affect the integrated results of sense amplifiers 80 or other read circuitry when trying to determine data of a select memory cell of the memory device. For example, noise of the Vs/3 supply that is biasing the 2047 passive wordlines might couple to the active bitline (or bitlines) via the 2047 passive capacitors therebetween to affect the integrity of a signal on the active bitline, which in turn might affect the accuracy of a data determination which is dependent on the signal integrity of the active bitline. However, by decoupling the external supply Vs/3, e.g., at time S2 of FIG. 7, the noise of the external supply may be isolated from the passive wordlines and, likewise, kept from affecting the integrity of the signals of the active bitline during reading of a select cell.

Similarly, in accordance with a further exemplary embodiment of the present invention, the bias Vs for the active wordline may be similarly decoupled, during the read operation. Referencing FIG. 5A, switch 108 may be opened responsive to a transition of the supply cut-off signal (e.g., supply enable signal 134 in FIG. 7) as established by the controller 62 (FIG. 4) at time S2 (FIG. 7).

For another exemplary embodiment, another switch 101 may be electrically disposed in series with the supply line to the source of reference voltage $V_{BL}$. Switch 101 may also be opened by the supply cut-off signal during the read operation.

While the switches are open (block 206 of FIG. 8), decoupling capacitors 102 and 107 may service the current needs of the $V_s$ and $V_{BL}$ voltage requirements within memory device 100. To mitigate the amount of current to be drawn from these decoupling capacitors, in accordance with a particular exemplary embodiment of the present invention, the switches may remain closed until at least a majority of sneak current has been withdrawn (block 204 of FIG. 8) from cells associated with the active bitline.

Returning to FIG. 4, in accordance with another exemplary embodiment of the present invention, decoupling circuits may also be provided for the supply(s) that bias the passive bitlines, e.g., 2Vs/3. Should the passive bitlines receive noise from their bias source, e.g., 2Vs/3, the noise might couple from the passive bitlines (PBL) to the wordlines 48 via the passive cells therebetween, and then to the active bitline (ABL) via cells coupled between the wordlines and the active bitline. To prevent this from happening, decoupling circuitry 66 of FIG. 4 may include a switch and capacitor to decouple the external source of the voltage 2Vs/3 during the read operation. The switch may be disposed in series with the supply line to the external source of the voltage 2Vs/3 and a decoupling capacitor may be attached to an internal node on a memory side of the switch (opposite the external source for the voltage 2Vs/3). Such switch and capacitor may be configured similarly to the configuration of switch 104 and capacitor 106 as described relative to the decoupling for voltage Vs/3.

Continuing with reference to FIGS. 4–7, data states of select memory cells may be determined (block 208 of FIG. 8) after the supplies have been isolated. At time S3, the reset bitline signal $RST_{BL}$ may transition to a level that disables MOSFETs 92,96 of FIGS. 5A and 5B for enabling sense amplifiers 80A,80B,80C . . . 80H to begin a first integration time window. During this time window, with MOSFET 96 turned off, the reference bitlines may be left floating and may propagate reference charge/voltages thereof to their respective buffers 90. With MOSFET 96 turned off, noise from other $V_{BL}$ applications of the memory may be isolated from the reference bitline.

At time S4, row multiplexer & bias circuitry 56 may switch a bias of the active wordline from Vs/3 to a read level voltage $V_s$ as represented by waveform 124. The sense amplifiers 80 may integrate signals (voltage/current) of respective active bitlines 16 for a duration of several microseconds, in order to determine charge that may be released from the select active ferroelectric cells. Upon conclusion of the first integration window, at time $S_5$, first integration values may be obtained by sampling (via sampling circuits not shown in FIGS. 5A and 5B) the outputs of the sense amplifiers.

After obtaining the first integration values, the sense amplifiers may be cleared responsive to a transition of the reset bitline signal $RST_{BL}$ as represented by waveform 132 at time S6, and the active wordline may be returned to its quiescent voltage level of $V_s/3$, as represented by waveform 124 at time $S_6$. MOSFETs 92 receive the reset signal $RST_{BL}$ of a magnitude for enabling the MOSFETs and shorting the plates of the integrating capacitors 94 to clear previous accumulations of the respective integrating sense amplifiers. Additionally, MOSFET 96 may be enabled to allow capacitor 102 to restore a voltage of the reference bitline 122 to substantially $V_{BL}$. The reset duration may last for, e.g., several microseconds, a duration that may be sufficient to allow the active ferroelectric cells of the active bitlines to establish remnant polarization conditions.

Next, at time S7, the reset bitline signal $RST_{BL}$ may transition low to enable the sense amplifiers to start a second integration window. At time S8, the active wordline signal 124 again may transition to a read level voltage $V_s$. Over the second integration duration, residual charges propagated by the active bitlines 16A, 16B, 16C . . . may be received and integrated by their respective integration sense amplifiers 80A,80B,80C . . . 80H.

At the conclusion of the second integration time window, at time $S_9$, second integrated value samplings may be obtained from the sense amplifiers. The second integration value may be subtracted from the first and the difference between the two compared to a threshold value to determine the data states of the select ferroelectric cells. Following the second integration time window, the active wordline may be returned to its quiescent level voltage $V_s/3$ as represented by waveform 124 at time $S_{10}$. Additionally, switches (e.g., 101, 104, 108 . . . ) of supply decoupling circuitry 66 may restore (block 209 of FIG. 8) electrical coupling of the internal supply nodes 70 to their external supplies 68, and the active and passive bitlines may return to their quiescent level voltages of $V_s/3$ as portrayed by the waveforms 134,121,126 of FIG. 7.

The sense amplifiers 80 may perform their integrations, referencing FIGS. 5A–5B, when the switches 92 and 96 are open for integrating the differences in voltages between the active bitlines 16 relative to the reference bitline 122. During the integrations, buffer 90 may buffer the voltage of the reference bitline for presentation to the positive terminals of the respective integrating sense amplifiers 80, and for presentation to terminal 89 as a reference node associated with the output signals of the sense amplifiers 80A,80B,80C . . . 80H.

Typically, the integration sense amplifiers 80 may be enabled before activation of the active wordline (referencing waveforms 132 and 124 of FIG. 7), and both the positive and negative input terminals of integration sense amplifiers 80 (FIG. 5B) may receive substantially equivalent residual charge contributions for the components associated with stray capacitive couplings from the active wordline 12 to the active bitline(s) 16, and from the active wordline 12 to reference bitline 122. To preserve a similarity between the reference cells and the memory cells, the reference cells and reference bitline within the array may be driven the same as the data cells and data bitlines. With similar handling, the reference cells may fatigue and age substantially the same as the data cells. Accordingly, over a life span of the memory device, residual charges that may be released by zero state active cells, during activation of the active wordline, may be substantially similar to the charges that may be released by the reference cells. Additionally, the similar stray capacitive couplings and similar residual zero-state polarization alignments of the reference and active ferroelectric cells may effect similar residual charge contributions to their reference and data bitlines, respectively, so as to substantially cancel one another at the differential, integrating amplifiers 80.

With the ferroelectric memory device isolated from external supplies during the integration intervals, the sense amplifiers may determine values for the released charge with reduced risk of noise artifacts from the supplies. The decoupling capacitors on the memory device side of the isolation switches may have capacitance values that may sustain operation of the ferroelectric memory device during the memory read operations.

In accordance with an alternative embodiment, the switches may be restored during a dwell interval between the two integrations. After the first integration time window and after having obtained the first integration value from the sense amplifier, e.g., at time S6, the supply-enable signal may transition high momentarily for recharging the decoupling capacitors. Thereafter, at time S7 after the reset, and typically, before the start of the second integration time window, the supply enable signal 134 may again transition to a level for opening the switches and decoupling the external supplies.

In accordance with yet a further alternative embodiment of the present invention, the switches, e.g., including switch 101, of the decoupling circuitry 66 may comprise MOSFETs, and the control node 65 may receive the supply-cut-off control signal of the controller 62. This control signal may take on a range of values to establish a variable range of resistance for the pass-gate MOSFETs. At a particular control signal level, a high resistance channel of the MOSFET 101' may establish a low pass filter in combination with the decoupling capacitor 102 for decoupling noise of the external supply source of, e.g., voltage $V_{BL}$.

With reference to FIG. 9, in accordance with an exemplary embodiment of the present invention, a switch 104 of decoupling circuitry 66A may comprise a plurality of MOSFETs 104A,104B,104C . . . 104D having their channels coupled in parallel with each other. The group of parallel-coupled MOSFETs 104 may be electrically disposed in series within path 109 between internal supply node 70B and external supply pad 105. A first group of the MOSFETs, e.g., 104A,104B,104C, may have their control inputs 65A coupled to receive a first supply cut-off control signal of a controller (e.g., 62 of FIG. 4). A second group of MOSFETs comprising at least one MOSFET, e.g., 104D, may have its control inputs 65B coupled to receive a second supply cut-off control signal of the controller. Capacitor 106 may be coupled to the internal node 70B on the memory side of the parallel-coupled MOSFETs 104 and may decouple noise of the supply node 70B.

As shown in the schematic diagram of FIG. 10, the MOSFETs of the decoupling circuit may be modeled as parallel coupled resistors 104A–104C,104D in series with the electrical path 109. Assuming both of the control signals $C_{NTRL1}, C_{NTRL2}$ have levels to enable respective groups of transistors 104A–104C,104D, then the combined resistors in combination with capacitor 106 may form a low-pass circuit of cut-off frequency defined by $$\omega_{c1} = \frac{1}{RC} \qquad \qquad \text{Equation 1}$$

$$R = R1(\text{on}) \| R2(\text{on}) \qquad \qquad \text{Equation 2}$$

where R1(on) is defined by the on-resistance of the first group of enabled, parallel-coupled transistors 104A–104C, and R2(on) is defined by the on-resistance of the second group of enabled, parallel-coupled transistors 104D.

During an exemplary method of operation, a controller may disable one group, e.g. 104A–104C, of the plurality of transistors during certain memory operations. Such operation may be helpful where the power reserve of the decoupling capacitor, for example, capacitor 106 may be insufficient to sustain operations of the memory device during, e.g., a read operation. During such read operation, the first group may be disabled and the resistor of the low-pass filter may become R=R1(off)∥R2(on)≅R2(on).

With one of the groups, e.g., 104D, of the parallel-coupled transistors enabled, a power reserve of decoupling capacitor 106 may be maintained to service the memory device during, e.g., the read operation. Following such read operation, the first group, e.g., 104A–104C, may be re-enabled.

Alternatively, all transistors may be disabled, wherein the cut-off frequency of the low-pass filter may be defined by $$\omega_{c2} = \frac{1}{RC} \qquad \qquad \text{Equation 3}$$

$$R = R1(\text{off}) \| R2(\text{off}). \qquad \qquad \text{Equation 4}$$

Such operation is analogous to the exemplary embodiments described earlier herein, in which the decoupling capacitor 106 may service the current needs of the memory device when the transistors have been disabled for isolating the memory from the external supply of pad 105. However, in accordance with this particular embodiment, when the read operation is complete, only one, e.g., 104D, of the two groups of transistors may be re-enabled to replenish a power reserve of the decoupling capacitor 106.

In accordance with another exemplary embodiment of the present invention, both groups 104A–104C,104D of transistors may be disabled during two separate integration time windows S3–S5,S7–S9 of a dual-read method of reading a ferroelectric memory, similarly as disclosed previously herein relative to FIG. 7. However, during a reset dwell interval S6–S7 between the two integration time windows, a single group, e.g., 104D, of the transistors may be enabled to replenish a reserve of capacitor 106.

In accordance with another method of operation, the controller may enable both groups of transistors 104A–104C,104D during power-up operations of the memory device. After initial power-up, one group of the transistors may be turned off. During continued operation, both sets may again be enabled during high current demands of the ferroelectric array. For example, both groups might be enabled when driving a plurality of wordlines or bitlines simultaneously with a signal transition, or when drawing sneak currents from select bitlines of the memory array.

Figure 11:
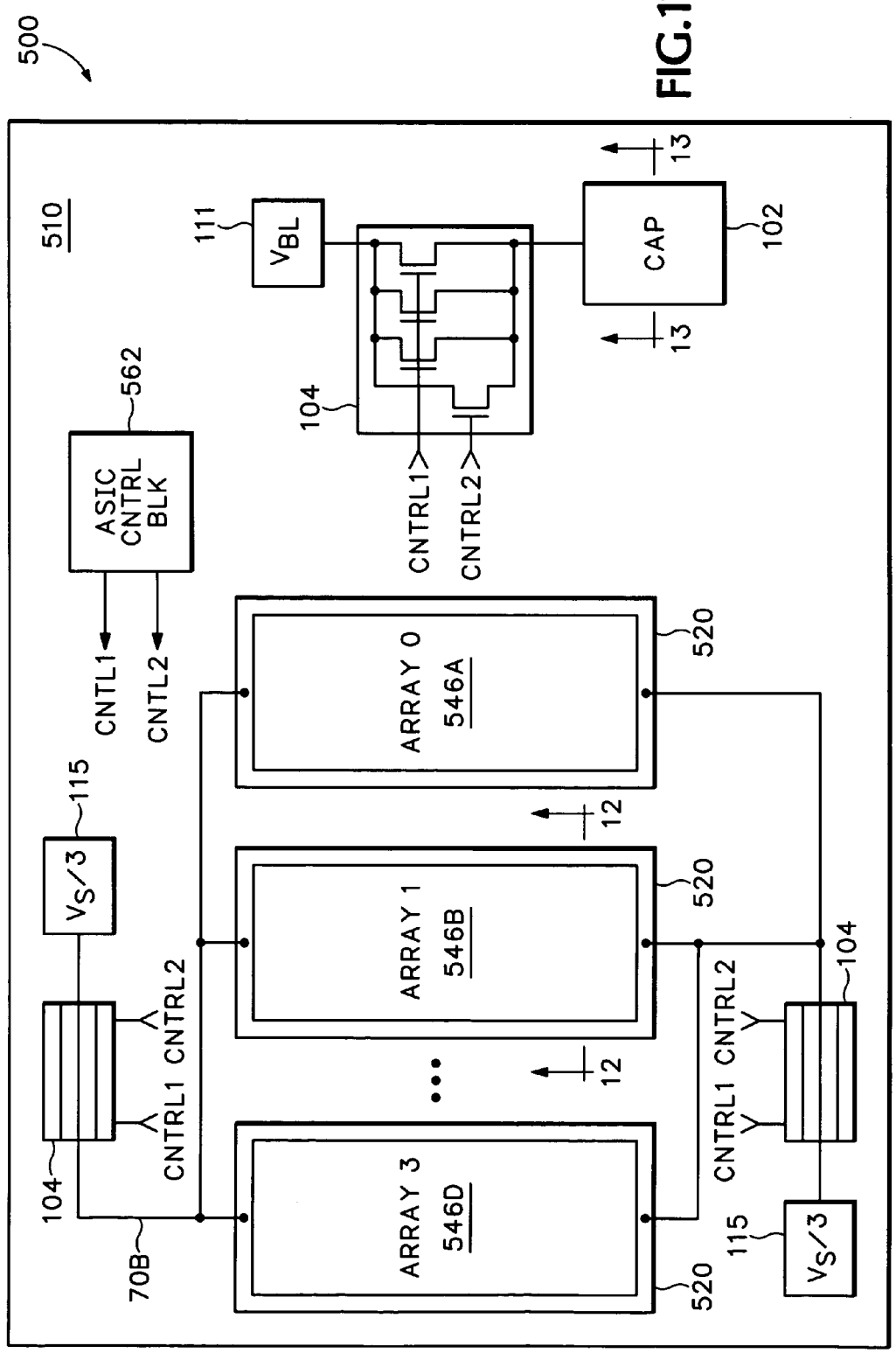
FIG. 11 is a simplified and schematic planar illustration of a memory module as may be associated with an exemplary embodiment of the present invention, showing decoupling circuitry and memory arrays.

In accordance with another exemplary embodiment of the present invention, referencing FIG. 11, a memory device 500 may comprise a plurality of ferroelectric memories 546A–546D disposed over supporting substrate 510. For purposes of simplifying the description of certain exemplary embodiments of the present invention, the partial schematic and planar view of FIG. 11 may omit known, or previously described, portions of the memory device—e.g., including but not limited to the data I/O circuitry, electrical couplings to ferroelectric memories 546, etc. Continuing with the simplified planar and cross-sectional views of FIGS. 11–12, supporting substrate 510 is shown with a P-type substrate having a plurality of N-wells 520. Ferroelectric memories 546A–546D may be disposed over the various N-wells 520. In FIG. 11, the N-wells 520 are shown with rectangular outlines. However, in accordance with alternative embodiments, the N-wells may comprise planar outlines of alternative shape, e.g., elliptical, circular, or oblong, etc.

Further referencing FIGS. 11,12,12B, N-well 520 may establish one plate of a capacitor 106" and may be coupled to internal node 70B for receiving a supply of voltage, e.g., Vs/3. P-material of substrate 510 may receive bias $V_{ss}$ and may establish the other plate of the capacitor. In operation, the voltage Vs/3 comprises a potential greater than the substrate bias $V_{ss}$ to form an intrinsic region 530 between the N-P junction of N-well 520 and P-substrate 510. The junction may be modeled as capacitor 106" as illustrated in FIG. 12B.

Memory device 500 may be referenced more generically as a module and may further comprise pass-gate 104 (e.g., MOSFETs of parallel-coupled channels) electrically disposed in series between the internal supply node 70B and pad 115 to the source of the supply, e.g., Vs/3. Control circuitry 562 may establish control signals CNTL1 and CNTL2 to adjust states of the pass-gate 104, similarly as described before relative to FIGS. 5–9.

In accordance with a further exemplary embodiment of the present invention, memory device 500 may comprise decoupling circuitry to decouple the bitline reference voltage $V_{BL}$. Pass-gate 101 may be electrically disposed in the serial path between capacitor 102 and pad 111 associated with receiving the external supply for voltage $V_{BL}$. As shown in the exemplary embodiment of FIG. 11, the pass-gate may comprise a plurality of MOSFETs of parallel-coupled channels that may be configured similarly to an embodiment presented before relative to FIG. 9.

Alternatively, pass-gate 101 may comprise a single MOSFET, transistor, or switch, that is responsive to a control signal of controller 62. The pass-gate 101 may be operable to provide a channel resistance, e.g., high/low, dependent on the value of the control signal.

Referencing FIGS. 11, 13–13B, capacitor 102, e.g., may comprise metal or poly 550 disposed over a layer of insulating material 540 over P-substrate 510. In accordance with a particular exemplary embodiment, metal 550 may comprise a portion of a gate-metal layer as may be provided for the gates of other transistors integrated with substrate 510, and insulating material 540 may comprise a portion of the gate-oxide layer formed for the other transistors integrated with substrate 510. In accordance with a further exemplary embodiment of the present invention, capacitor 102 may comprise at least one MOSFET having its source-drain regions shorted together to form one plate of the capacitor. The gate of the MOSFET may serve as the other plate of the capacitor.

Processor System with Decoupling During Memory Operations

Referencing FIG. 14, in accordance with another embodiment of the present invention, a processor system 400 may comprise processor 420 coupled to bus 440. Bus 440 may be coupled to a plurality of sub-systems of the processor system 400, including, e.g., a keyboard, mouse, microphone, monitor, sampler interface, network interface card, printer, disk storage and the like 460. Additionally, bus 440 may interface memory module 500 of an embodiment disclosed previously herein. For example, memory module 500 may comprise memory 546, controller 62 and supply decoupling circuitry 66. Memory module may receive power from supplies 68. Controller 62 may be operative to interpret commands provided by bus 440, e.g., from processor 420, and controls portions of the memory module to act dependent upon the interpreted commands.

Decoupling circuitry may be responsive to controller 62 to decouple at least one supply of the external supplies 68 from the memory 546 during particular operations thereof. In accordance with a more particular exemplary embodiment, controller 62 may configure decoupling circuitry 66 to isolate at least one supply of the external supplies 68 from an array of ferroelectric cells of memory 546 during a read operation of the memory device.

In accordance with an alternative exemplary embodiment, processor system 400 may comprise decoupling circuitry 66 that may be remote from memory module 500 as represented by the dashed lines of FIG. 14. The decoupling circuitry may be responsive to controller 62, or alternatively to a separate memory controller, to decouple at least one supply of the supplies 68 during read operations of memory 546.

Re-Write

During a read operation, the data of selected cells of the ferroelectric memory may be lost. Having possibly destructively read the select cells, a write cycle may be performed to re-write one state conditions of cells that may have provided one-data during the previous read.

Initially, at time $S_{13}$ in FIG. 15, the wordlines and bitlines 48,50 (FIGS. 4, 5A and 5B) may receive bias levels of $V_s/3$ as illustrated by waveforms 120–126. The reference bitlines likewise receive bias levels of $V_s/3$. With these voltage levels, the ferroelectric material of the cells of memory array 46 may experience applied electric field influences of zero magnitude and the select ferroelectric cells that may have been destructively read may retain remnant polarizations of zero data-state conditions. Rewrite control circuitry (not shown) may determine which of the selected bitlines yielded one data and may then designate cells thereof to be rewritten with one data. During the rewrite, the rewrite control circuitry may apply signals (as represented by FIG. 15) to the active bitlines of the array for storing data therein. For example, a high level signal 126A may be applied to active bitlines for rewriting one data or, alternatively, a low level signal 126B may be applied to the active bitlines for those that are to retain the zero-state conditions.

At time $S_{14}$, the passive wordlines may transition to $2V_s/3$ and active selected wordlines 16 may drop to 0 (i.e., the voltage of the reference bitline offset level $V_{BL}$). Cells between the passive wordlines and bitlines may experience a voltage of $V_s/3$, and cells between the active wordlines and bitlines may experience a voltage of $-V_s/3$. Next, for the selected cells between the active wordline and active bitlines that are to receive one data, write circuitry may drive their active bitlines 16 with $V_s$ level voltages, as represented by signal 126A at time $S_{15}$, for setting polarizations of the select cells to one data-state conditions. For other cells that are to retain zero state conditions, the write circuitry may leave their bitline bias level at $V_s/3$, as represented by signal 126B.

Between times $S_{15}$ and $S_{16}$, a sufficient duration may be allowed to permit the polarizations of the ferroelectric material to be set. In accordance with a particular exemplary embodiment, the duration of the write-time may be several microseconds. During this interval, the cells that are being set to their one-state conditions may receive the voltage influence of $-V_s$ (traversing curve 34 to position 27 of the hysteresis curve of FIG. 3). The non-active cells between the passive wordline and the active bitline may receive a quiescent level voltage influence of $V_s/3$.

To conclude the write sequence, the bias of the active bitlines may be returned to $V_s/3$ at time $S_{16}$, and thereafter, e.g., at time $S_{17}$, the bias levels of the passive and active wordlines may be returned to $V_s/3$.

Self-Timing and Data Determination

As described above with reference to FIG. 7, when reading a ferroelectric memory cell, two samples of the integrated charge may be obtained from two separate integrations of the signal that is carried by the active bitline. For example, a first integration may accumulate charge that may be released from an active cell over a duration of a first integration (SENSE1 from time S3 to time S5) and a first sample of the accumulation may be obtained after the duration of the first sense. Next, a second integration may be performed (SENSE2 from time S7 to time S9) and a second sample of the accumulation of charge may then be obtained at the end of the duration of the second integration. The second sample may be subtracted from the first and the difference between the two used for determining a data value.

In accordance with a further embodiment, the difference may be compared to a threshold level. In this embodiment, the threshold may be set to a level between a one state and a zero state.

The durations for the first and second integrations may be kept the same and set to allow them to capture a majority of the charge that may be released from an active cell. Ideally, the integration durations permit a majority of domains of the ferroelectric material to align their polarities with the polarization influence of an applied stimulus—e.g., the stimulus of an electric field when a read level voltage activates a wordline. But the duration for such polarity alignments may vary from one device to another dependent upon the responsiveness of the ferroelectric material. Ferroelectric material of one manufacture may respond slowly to electric field influences, suggesting a need for large integration durations. In contrast, ferroelectric of another manufacture might respond more rapidly and permit integrations of shorter duration.

Additionally, the responsiveness of the material may vary over the course of its life span. In its infancy, the material may have a slow responsiveness. In its later life, it may become more malleable and responsive. Likewise, the responsiveness may vary with temperature or other environmental influences.

To account for these variations in conditions, a time for the durations of the integrations may be set to a large fixed duration. But such large durations may seem to waste available performance capability. For when the material is more responsive, the fixed long durations for covering the worst case conditions would seem to sacrifice performance capability. The longer duration may also accumulate extra charge from sneak currents that may persist after capture of the primary released charge. Such extra accumulation of charge may compromise a reliability of data determinations.

In accordance with exemplary embodiments of the present invention, the durations for the integrations may be established dependent upon a monitored real time trait of the material associated with the sense operations. In other words, exemplary embodiments of the present invention may track traits of the material and establish durations for the integrations dependent on the monitoring. In some of these embodiments, the durations may be set to provide intervals sufficient to capture a majority of the released charge, but not so long as to degrade sense operations with extra (i.e., sneak current) charge accumulations. By compensating or correcting the durations of the sense integrations in this fashion, the exemplary embodiments may be described as self-adaptive, self-regulating, self-compensating or self-calibrating—being able to affect the durations in real-time dependent upon characteristics of the ferroelectric material.

Hereinafter, the description may term the self-adaptive techniques (for establishing the length of times for the durations of the sense integrations in accordance with the material characteristics) as being "self-timed." As will be understood and described more fully below, such self-timed durations may be affected in real time dependent upon the real-time characteristics of the material associated with the memory device.

Sampling Comparators

Figure 16:
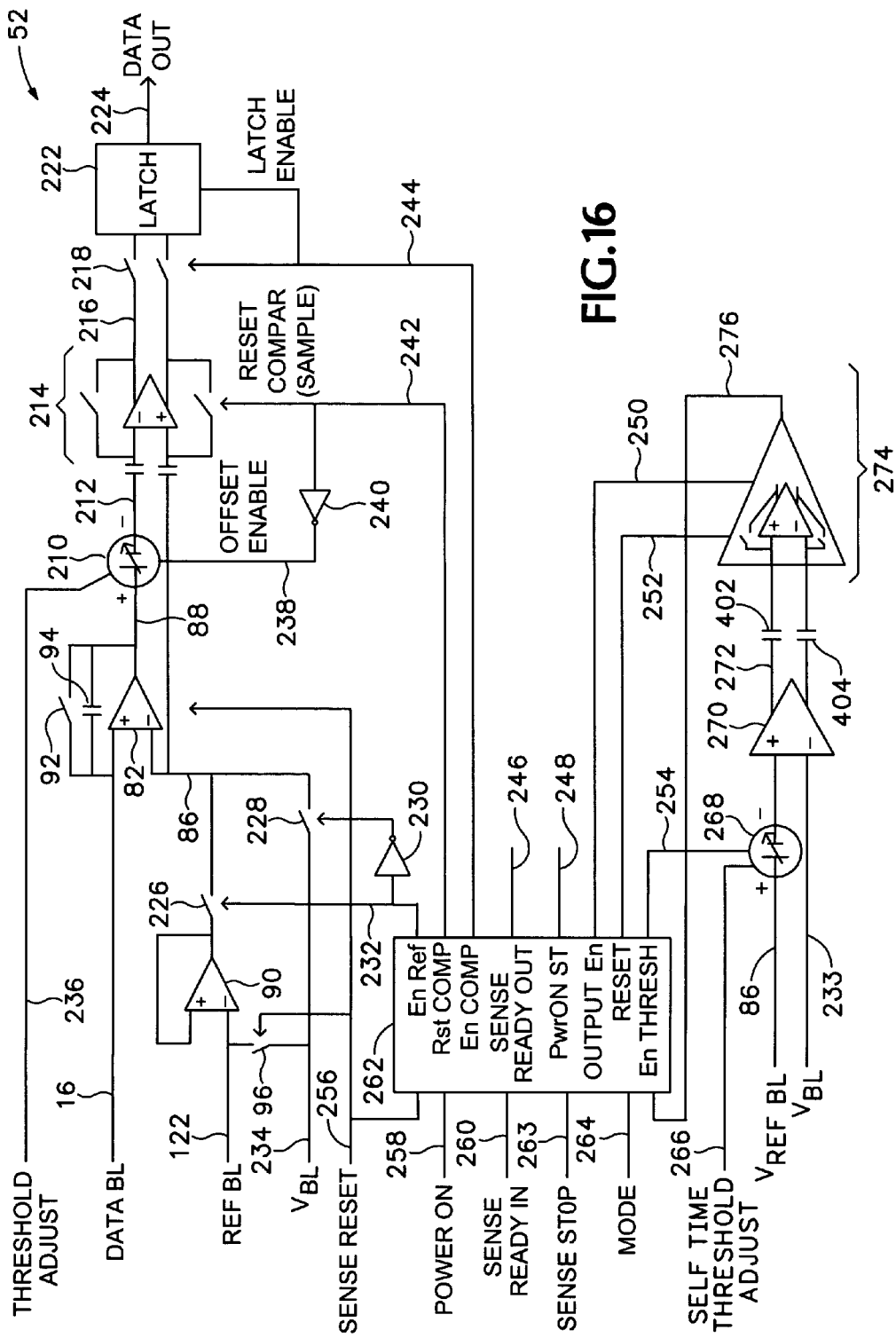
FIG. 16 is a simplified schematic diagram of a portion of a ferroelectric memory showing circuitry to sense data of the memory in accordance with an embodiment of the present invention.
Figure 25:
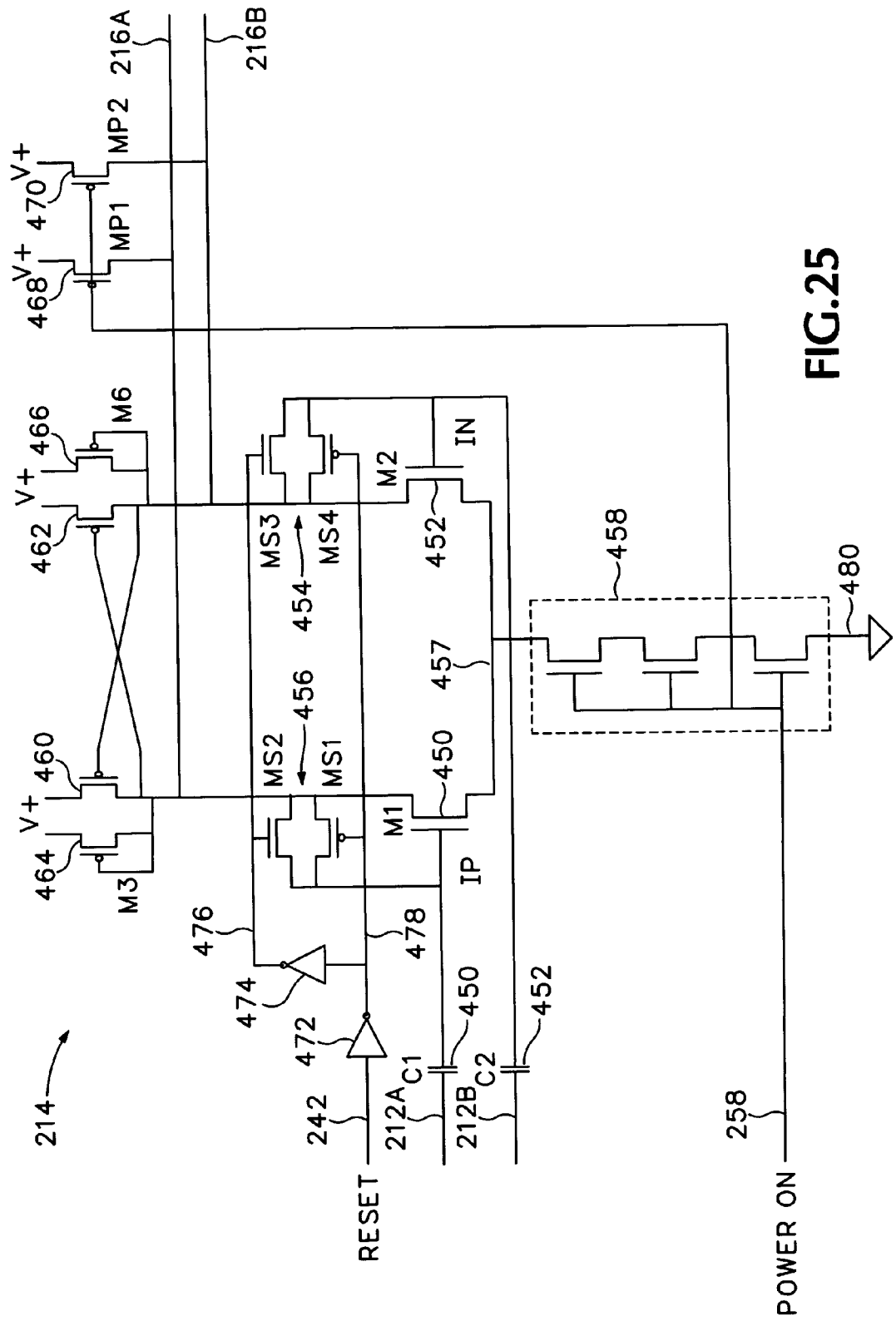
FIG. 25 is a schematic diagram of a sampling-comparator that may be used in a data determination circuit of FIG. 16.

Referencing FIGS. 16 and 25, switches 456,454 of sampling comparator 214 are closed during a first integration period. The gate terminals (nodes IN and IP) of differential NMOS transistors 450,452 receive bias levels equal to the upper supply V+ (e.g., 5 volts) minus a threshold (e.g., 0.6 to 1.0 V) of PMOS transistors 464, 466. PMOS transistors 464,466 have their drain and gates shorted to provide diode-like functionality between the upper supply V+ and drain nodes 216A,216B. Additionally, when switches 454, 456 are closed, NMOS transistors 450,452 similarly function as diodes serially coupled to bias node 457 of the differential amplifier. Assuming symmetry of the differential amplifier, each arm may receive half of the bias current, which may be established by the three serially configured NMOS transistors of the current source of bias leg 458. The gates of the NMOS transistors of the leg 458 may all be driven by the signal POWER ON (via line 258). When the bias leg 458 is enabled by the high level of the signal POWER ON, PMOS transistors 468,470 (at the output of the comparator) may be disabled at about the same time.

When sense amplifier (52 of FIG. 4) is not being used, the control signal POWER ON, which may be established by a read/write controller (62 of FIG. 4), may be held low for turning off bias leg 458 (FIG. 25) of the differential amplifier. To keep nodes 216 at the output of the differential amplifiers from floating when the sense amplifier is not in use, the low level of the POWER ON signal may enable transistors 468,470 and short output nodes 216A and 216B of the differential amplifier to the upper supply V+.

Referencing FIG. 16, current conservation provisions may also be provided for the other elements of the sense amplifier 52—i.e., which current conservation provisions may allow controllable operability similar to that provided to sampling comparator 214 by bias leg 458 and shorting switches 468,470. These current conservation provisions may enable power-up or power-down of the various elements of the sense amplifier dependent upon the level of the POWER ON control signal (at node 258). For example, each of amplifiers 82,90,270 may have biasing circuits that may be turned off when the POWER ON control signal transactions low. In the present disclosure, such controllable biasing provisions may not be shown or further described so as not to obscure other aspects of the present invention; however, it will be understood that the exemplary embodiments of the present invention may include such power conservation provisions similar to those, e.g., of bias leg 458 and shorting switches 468,470 as associated with sampling comparator 214.

Continuing with the first integration, with further reference to FIGS. 16 and 25, amplifier 82 may accumulate charge across integration capacitor 94 while integrating a signal of data bitline 16 relative to that of reference bitline 122 (as buffered by buffer 90). Output 88 of the integrator may charge an input plate of sampling capacitor 450 (FIG. 25) of sampling comparator 214. The other plate of sampling capacitor 450 receives the potential (e.g., 5V-Vth) that is established at node 216A of the differential amplifier while switches 454,456 of sampling comparator 214 are closed. During this integration interval, threshold adjust 210 (FIG. 16) may be disabled by control signal OFFSET ENABLE (via inverter 240). Capacitor 450 establishes a charge between its plates proportional to the value of its capacitance and the voltage of the integration amplifier's output 88 relative to the voltage level of node 216A.

Likewise, the capacitor 452, which is associated with the negative input terminal 212B (FIG. 25), may acquire charge proportional to its capacitance and the voltage level of the reference bitline (via buffer 90 FIG. 16) relative to the voltage level of node 216B. In this exemplary embodiment, sampling capacitors 450,452 may have substantially the same capacitance. Of course, fabrication tolerances may result in capacitor values of finite differences.

After a duration of the first integration, the self-timer control circuit 262 may transition the RESET COMPARATOR control signal on line 242 to open switches 454,456 of sampling comparator 214 and to enable (via inverter 240) threshold adjust 210. With switches 454,456 open, the second plates of the sampling capacitors 450,452 (nodes IP,IN) are left floating.

After this transition of the RESET COMPARATOR control signal, further referencing FIGS. 16 and 25, the SENSE RESET signal may then be activated to close switch 92 and short capacitor 94 of the integration amplifier. Additionally, switch 96 may be closed to couple reference bitline 122 to receive the $V_{BL}$ offset voltage bias of line 234 and to re-establish (or reset) its offset voltage level. Output 88 of amplifier 82 (now operative as a buffer with switch 92 closed) presents the $V_{BL}$ offset voltage to the first plate of capacitor 450. When the input plate to sampling capacitor 450 experiences a change in voltage level, the change in voltage is transferred to the second plate—having the effect of retaining a charge sample of a magnitude proportional to the level previously established at the integration amplifier's output 88. This sample may be described as retained on the floating node IP of sampling comparator 214.

Similarly, the floating node IN between the gate of NMOS transistor 452 and sampling capacitor 452 may be described as acquiring a sample of the reference bitline voltage. The reference sample may have a magnitude representative of the level of the signal of the referenced bitline at the end of the duration of the first integration. The differential amplifier (comprising transistors 450,452, 460–466 with switches 254,256 open) of the sampling comparator now amplifies the difference in voltages between the nodes IN and IP at the gates of respective differential transistors 450,452.

Over the second integration duration, the SENSE RESET signal may transition low to enable the integrator and allow the reference bitline to carry signals of the reference bitline. With the integrator enabled, it may again integrate a signal of data bitline 16 relative to that of the reference bitline. Changes in the output of the integrator may likewise change the potential of the floating node IP (via capacitor 450) of the sampling comparator 214.

To assist a better understanding of certain embodiments of the present invention, equations may be defined for characterizing a few signal relationships of the sense amplifier. The voltage of the sampling comparator's node IP may be represented by the equation:

$$V_{IP}(t) = V_{88}(t) - V_{88}(t_2) - V_{ThresAdj} \qquad \text{Equation 3}$$

The voltage at the sampling comparator's other floating node IN may be represented by the equation:

$$V_{IN}(t) = V_{86}(t) - V_{86}(t_2) \qquad \text{Equation 4}$$

The difference in voltages between the floating IN and IP nodes may then be expressed by the equations:

$$\Delta V(t) = V_{IP}(t) - V_{IN}(t) \qquad \text{Equation 5}$$

$$\Delta V(t) = [V_{88}(t) - V_{88}(t_2) - V_{ThresAdj}] - [V_{86}(t) - V_{86}(t_2)] \qquad \text{Equation 5.1}$$

The output of the integrator may be expressed by:

$$V_{88}(t) = -\frac{1}{C_{94}}\left[\int I_{DataBL}(t)dt + \frac{C_{DataBL}}{C_{RfBl}}\int I_{RefBL}(t)dt\right] \qquad \text{Equation 6}$$

$$I_{DataBL} = I_{ActiveCell} + I_{SneakDataBL} \qquad \text{Equation 7}$$

$$I_{RefBL} = I_{SneakRef} \qquad \text{Equation 8}$$

Additionally, it may be noted that $V_{86}(t)$ is representative of the output of buffer 90, which may buffer the voltage $V_{REfBL}$ of the reference bitline.

At the end of a duration of the second integration, the LATCH ENABLE control signal of line 244 (FIG. 16) transitions to close switches 218 and couple the comparator's output 216 to latch 222. Additionally, latch 222 may then determine and latch a data value dependent upon the value of $\Delta V$ at the end of the duration of the second integration. This enabling of the latch may also be characterized as obtaining a "second sampling" of the integrated signal of the integration amplifier's output 88. In this embodiment, it represents a time at which the integrated signal of output 88 is "acted upon" by the sampling comparator 214.

With further reference to FIGS. 16, 17–18, exemplary embodiments of the present invention may monitor a level of the reference bitline and establish a duration of at least one of the first and second integrations dependent upon the real-time level of the reference bitline.

From the expression of Equation 5.1, the last portions $V_{86}(t)-V_{86}(t_2)$ may be dropped if the value of $V_{86}(t)$ at the end of the duration of the second integration (at time $t_4$) may be made equal to that at the end of the duration of the first integration. For example, if the value of $V_{86}(t_4)$ at the end of the duration of the second integration is substantially equal to $V_{86}(t_2)$, then Equation 5 may be re-written as:

$$\Delta V(t_4) = [V_{88}(t_4) - V_{88}(t_2) - V_{ThresAdj}] \quad \text{Equation 5.2}$$

Substituting from equations 6–8, the value of $\Delta V(t_4)$ may be expressed as follows $$\Delta V(t_4) = \frac{1}{C_{94}} \left\{ \int_{t_3}^{t_4} \left[ I_{DataBL}(t) - \frac{C_{DataBL}}{C_{RfBL}} I_{RefBL}(t) \right] dt - \int_{t_1}^{t_2} \left[ I_{DataBL}(t) - \frac{C_{DataBL}}{C_{RfBL}} I_{RefBL}(t) \right] dt \right\} - V_{Thr} \quad \text{(Equation 5.3)}$$

Again, if the contributions from the reference bitline may be made substantially equal in the two separate integrations, then the reference bitline components may be dropped. Thus, the difference equation may then be simplified as $$\Delta V(t_4) = \quad \text{Equation 5.4}$$
$$\frac{1}{C_{94}} \left\{ \int_{t_3}^{t_4} [I_{DataBL}(t)] dt - \int_{t_1}^{t_2} [I_{DataBL}(t) dt] \right\} - V_{ThresAdj}$$

Substituting Equation 7 for the term $I_{DataBL}$, the difference equation may be further represented as follows (Equation 5.5):

$$\Delta V(t_4) = \frac{1}{C_{94}} \left\{ \int_{t_3}^{t_4} [I_{ActiveCell}(t) + I_{SneakDataBL}(t)] dt - \int_{t_1}^{t_2} [I_{ActiveCell}(t) + I_{SneakDataBL}(t)] dt \right\} - V_{Thre}$$

If the sneak currents of the reference bitline have been adjusted to provide the same accumulated charge over the two separate integrations—i.e., which may include a procedure of self-timing the integration durations dependent upon the properties of the ferroelectric material—and by assuming the properties of the reference bitline to emulate (proportionately) characteristics of the data bitline; the sneak current accumulations of the data bitline may be assumed also to be substantially equal to one another at the end of the durations of the first and second integrations.

Although the sneak currents of the reference and data bitlines may not be identical, their relative ratios between integration durations should correspond to one another. For example, the ratio of the sneak currents for the data bitline between the first and second integrations should correspond to the ratio of sneak currents for the reference bitline between the first and second integrations. Accordingly, by this assumption, having set the accumulations of charge resulting from the sneak current of the reference bitline to be equal between the separate durations of the first and second integrations; it, likewise, may be assumed that the integration of sneak currents from the data bitline over the duration of the second integration may be substantially equal to that accumulated over the duration of the first integration. This may be expressed as follows:

$$\int_{t_3}^{t_4} I_{SneakDataBL}(t) dt \cong \int_{t_1}^{t_2} I_{SneakDataBL}(t) dt \quad \text{Equation 9}$$

Therefore, Equation 5.5 may be reduced to $$\Delta V(t_4) = \quad \text{Equation 5.6}$$
$$\frac{1}{C_{94}} \left\{ \int_{t_3}^{t_4} I_{ActiveCell}(t) dt - \int_{t_1}^{t_2} I_{ActiveCell}(t) dt \right\} - V_{Thre}$$

Turning back with reference to FIG. 3, the charge released from a cell of a zero state condition ($Q_{Zero}$) may correspond to the vertical extent of path 32 as it extends from point 22 to point 25 upon application of read voltage $V_s$. On the other hand, the charge released from a cell of a one state condition ($Q_{One}$) may correspond to the vertical extent of path 30 as it extends from point 24 to point 25. The difference between the two may be expressed by $$\Delta Q = Q_{One} - Q_{Zero} \quad \text{Equation 10}$$

This is the difference targeted for resolution by the sense amplifier operations. Rearranging this equation, the one state condition may be expressed by $$Q_{One} = \Delta Q + Q_{Zero} \quad \text{Equation 11}$$

Moving back to Equation 5.6, the difference voltage $\Delta V(t_4)$ expected to be presented to the comparator upon reading a cell of a one state condition at the conclusion of the duration of the second integration, now may be expressed by $$\Delta V(t_4) = \frac{1}{C_{94}} \{ [\Delta Q + Q_{Zero}] - Q'_{Zero} \} - V_{ThresholdAdj} \quad \text{Equation 5.7}$$

In this equation 5.7, the term $Q_{Zero}'$ is representative of the active cell's contribution during the second integration. Assuming that $Q_{Zero}$ is substantially equal to $Q_{Zero}'$, then the difference equation reduces to $$\Delta V(t_4) = \frac{\Delta Q}{C_{94}} - V_{ThresholdAdj} \quad \text{Equation 5.8}$$

On the other hand, the difference voltage $\Delta V(t_4)$ expected upon reading a cell of a zero state condition at the conclusion of the duration of the second integration may be expressed by $$\Delta V(t_4) = \frac{1}{C_{94}} \{ Q_{Zero} - Q'_{Zero} \} - V_{ThresholdAdj} \quad \text{Equation 5.9}$$

Ideally, the two terms $Q_{Zero}$, $Q_{Zero}'$ would be exactly equal to one another. But in the exemplary embodiments of the present invention, a threshold adjust value may be used to account for minor differences between the two. For example, it may be expected that more charge may be released from the active cell during the first integration than that released during the second. This may be explained by more domains of the ferroelectric material being more fully aligned with the polarization orientation of the zero state at the beginning of the second integration than those aligned at the beginning of the first integration.

Regardless, the value of the threshold adjust, in accordance with some exemplary embodiments of the present invention, may be set to a level that is less than the expected voltage that may be obtained from one state condition. In a particular exemplary embodiment, the level of the threshold adjust may be set between the levels representative of the zero and one states, e.g., to a level of about one-half the voltage established by a one-state condition relative to a zero-state condition. In this embodiment, the threshold adjust may be set for a level defined as follows:

$$V_{ThresholdAdj} \approx \frac{\Delta Q}{2C_{94}}$$ Equation 12

Accordingly, sampling comparator 214 may determine a data value by comparing the difference between the first and second sample accumulations to a threshold level established by the threshold adjust 210. If the difference between the two is greater than the threshold level, the data value may be established as a one. Alternatively, if the difference between the two is less than the threshold level, the data value may be established as a zero.

Relative to FIG. 16, the end of the second integration duration results in, the "second sampling". The LATCH ENABLE control signal transitions to close switches 218 and couple the comparator's output 216 to latch 222. Latch 222 may latch a data value result dependent on the level of the comparator's output signal.

Various Self Timing Modes

In accordance with an exemplary embodiment of the present invention, the accumulations of charge resulting from the sneak currents for the durations of the first and second integrations may be monitored and used to affect the lengths of one or both of the durations.

In accordance with an exemplary embodiment of the present invention, referencing FIGS. 16–18 and 21, a duration between times $t_1$ and $t_2$ (FIGS. 17–18) for a first integration may be established by the timing of transitions of the SENSE RESET signal 132 and SENSE STOP signal 304. In this condition (310 FIG. 21), the integrator begins integrating a signal of the data bitline (312 FIG. 21) after the SENSE RESET signal 132 transitions low at time $t_1$.

After starting the first integration, the voltage level of reference bitline 122 may begin to increase (signal 302 of FIG. 17) as the reference bitline (per its stray capacitance) accumulates charge of a sneak current. After a fixed duration, established by the transition of SENSE STOP signal 304 at time $t_2$ (FIG. 18), a first sample of the voltage level at the integrator's output 88 may be obtained. Self-timer controller 262, responsive to an active transition of the SENSE STOP signal at input 263, may activate the RESET COMPARATOR signal on line 242. In this embodiment, a read/write controller (62 of FIG. 4) generates the SENSE STOP signal for establishing the duration of the first integration. The duration may be several microseconds.

Figure 24:
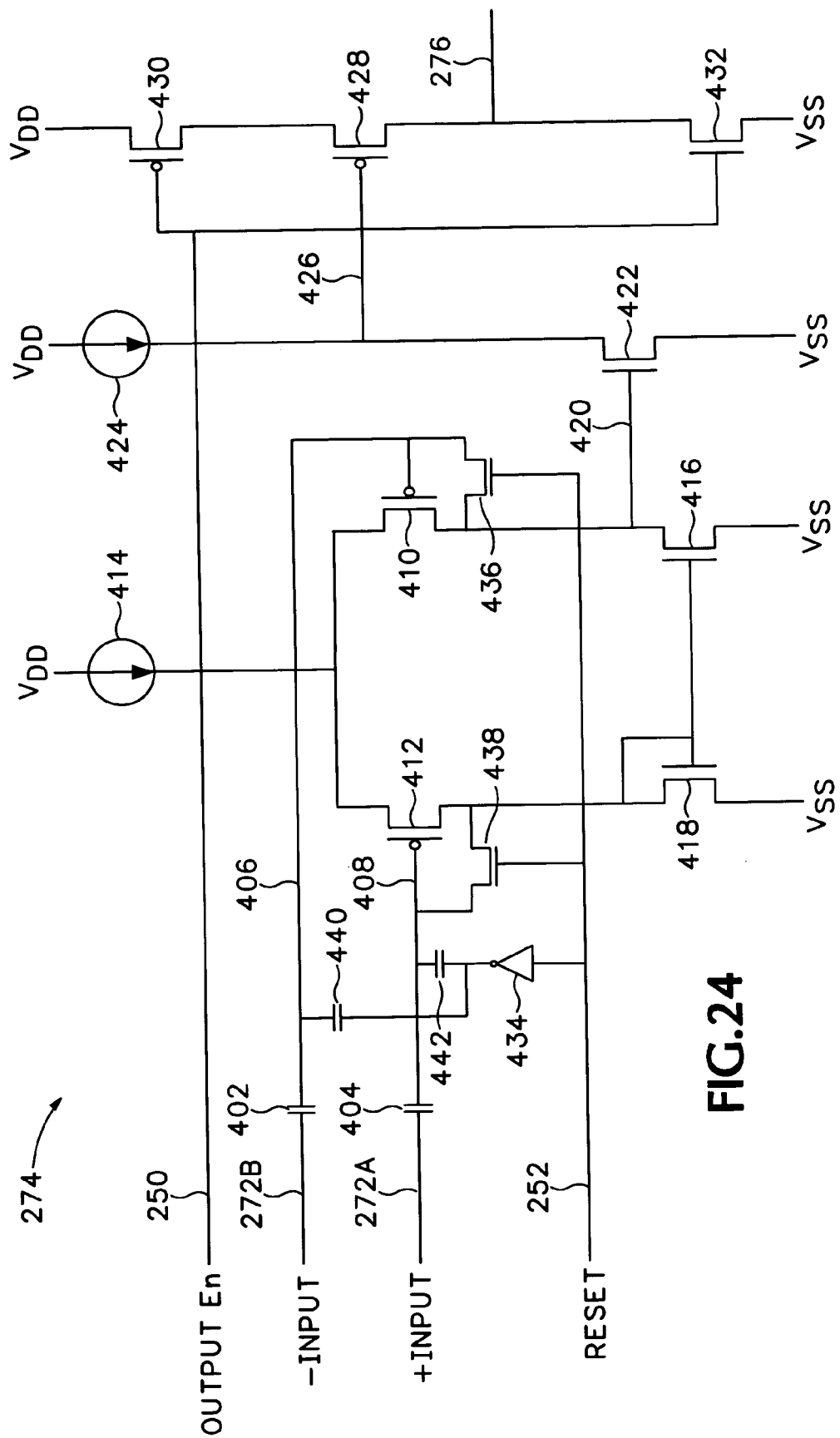
FIG. 24 is a schematic diagram of a sampling-comparator that may be used in a self-timing circuit of FIG. 16.

At the end of the first duration, at time t2, the sampling comparator 274 of the self-timer circuitry (262, 268, 270, 274) may obtain a sample of the voltage of the reference bitline (which may be defined relative to an offset voltage $V_{BL}$). The first sample of the reference bitline may be retained by way of sampling capacitors 402,404 of the sampling comparator 274 (FIGS. 16 and 24). It may be noted that the sampling comparator 274 of the self-timing circuit may be similar to sampling comparator 214 as described before relative to the signal path of the data bitline.

Self Timer's Sampling Comparator

Referencing FIG. 24, sampling comparator 274 of the self-timer circuitry comprises sampling capacitors 402,404, which may be serially disposed between inputs 272B,272A and gate nodes 406,408 of the differentially coupled, PMOS transistors 410,412 respectively. A reset line 252 may be coupled to drive switches (e.g., NMOS transistors) 436,438. Switches 436,438 allow selectable coupling between the drains and gates of respective PMOS transistors 410,412. Inverter 434 and capacitors 440,442 enable charge cancellations that might be attributed to transitions of a reset signal on line 252. When a transition of a reset signal on line 252 reaches the gates of NMOS devices 436,438, a charge addition or subtraction may affect the accumulated charge on floating nodes 406,408. Capacitors 440,442 may be sized in consideration of the voltage swing of inverter 434 so as to subtract/add charge to nodes 406,408 of an amount similar to the amount affected by the stray capacitive couplings of switches 436,438.

Further referencing FIG. 24, an output enable signal of line 250 may selectively enable the output stage of the sampling comparator 274. The output stage may comprise PMOS transistors 430,428 and NMOS transistor 432. NMOS and PMOS transistors 432,430 may have their gates coupled to receive the output enable control signal of line 250. NMOS 432 is serially coupled between the drain of PMOS transistor 428 and a lower supply while PMOS 430 is coupled serially between the source of PMOS transistor 428 and the upper supply. The gate node 426 of amplifier PMOS transistor 428 may be configured to receive the output signal of the differential amplifier. In this exemplary embodiment of FIG. 24, PMOS transistor 428 receives the output of the differential amplifier by way of amplifier 422,424.

Returning with reference to FIGS. 16–18 and 21, at time $t_2$ at the end of the fixed duration for the first integration, a first sample of a signal as the data bitline may be obtained (314 FIG. 21) by sampling comparator 214.

Additionally, for the self-timer circuitry, the voltage level of the reference bitline may also be sampled. The sample of the signal of the reference bitline may be retained by sampling comparator 274. The self-timer controller 262 may control when the sample is obtained by activating the self-timer's RESET control signal on line 252 responsive to activation of SENSE STOP signal at input 263. Activation of the self-timer's reset control signal may have the effect of opening the feedback switches 436,438 to the input stage of the self-timer's sampling comparator 274 (FIG. 24).

During a reset interval, between times $t_2$–$t_3$, the SENSE RESET signal 132 (FIG. 18 and with further reference to FIGS. 16–18) may transition high to close switch 96 and reset (315 of FIG. 21) the bitline offset bias $V_{BL}$ for reference bitline 122. Sampling comparator 274 of the self-timer circuitry may obtain a sample related to the voltage previously established across the sampling capacitor 402. This voltage is transferred across the sampling capacitors to the floating input nodes of the differential amplifier of the sampling comparator. This may occur while the output of the integration amplifier reestablishes the bitline offset bias $V_{BL}$. In this exemplary embodiment, the reset interval may last several microseconds.

Figure 21:
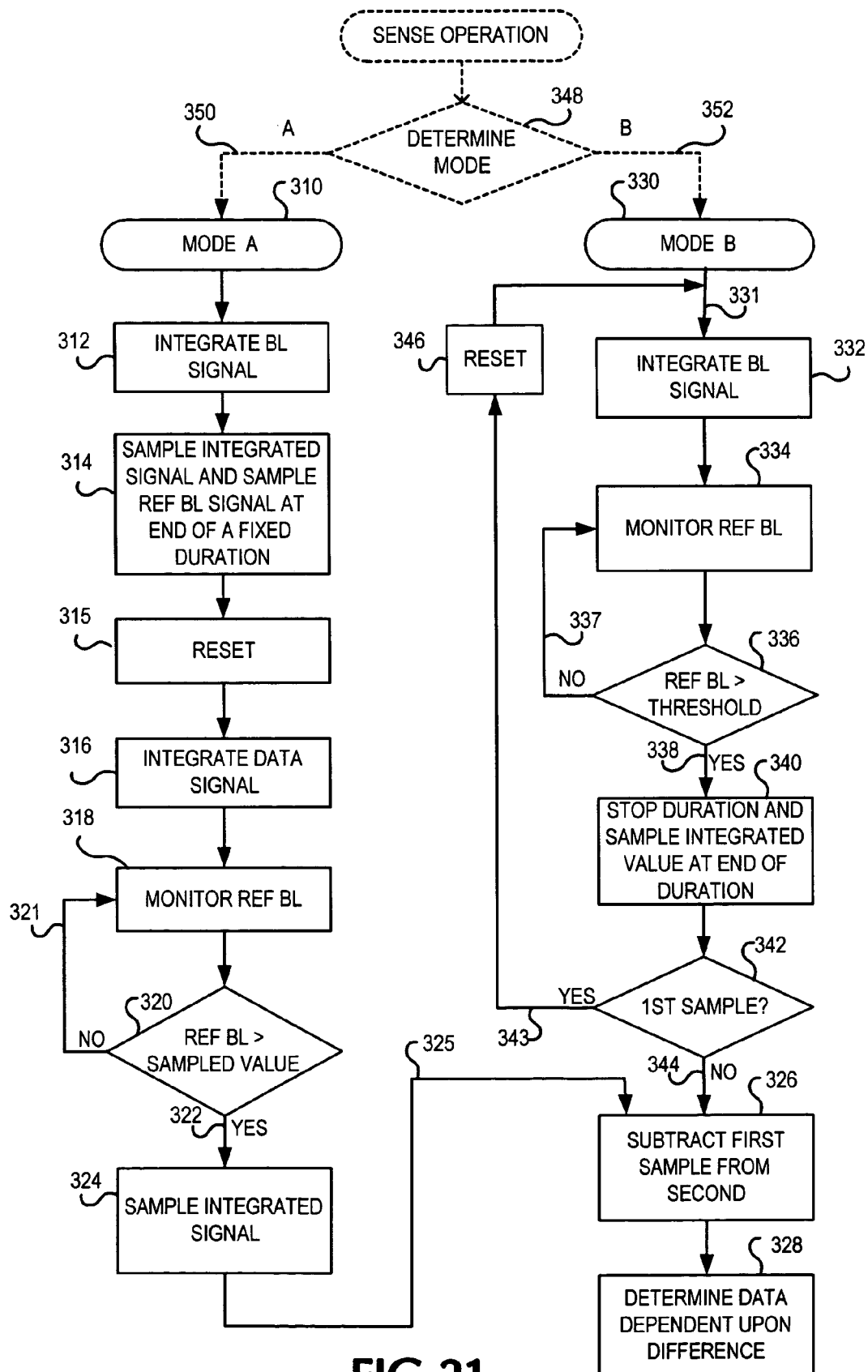
FIG. 21 is a simplified flow chart representative sensing data of a ferroelectric memory in accordance with exemplary embodiments of the present invention.

After the reset, at time $t_3$, the SENSE RESET signal 132 (FIG. 18) transitions low and a second integration of the data signal may begin (316 of FIG. 21). The voltage level of the signal 302 of the reference bitline may begin increasing between times $t_3$–$t_4$ (FIG. 17) as the reference bitline accumulates charge of sneak current released from reference cells of the reference bitline.

During the second integration, the level of the reference bitline may be monitored by the self-timer circuitry and compared (318,320,321 of FIG. 21) to the previously sampled level. Sampling comparator 274 of the self-timer circuit (FIG. 16) receives the level of the reference bitline, in this example, by way of buffer 90 and amplifier 270. The comparator determines when the level of the reference bitline reaches that of the previous sampling. When the level of the signal of the reference bitline reaches the level of the previous sampling, sampling comparator 274 drives its output 276 to forward a transition to the self-timer controller 262.

Further referencing FIGS. 16–18 and 21, after determining (320,322 of FIG. 21) that the level of the reference bitline has reached that of the previous sampling, self-timer controller 262 activates the LATCH ENABLE signal on line 244 to enable sampling comparator 214 to obtain a second sampling of the integrated data bitline signal. Sampling comparator 214 may determine a data value (324–328 of FIG. 21) based upon the first and second samples. In this embodiment, the determination may be based upon a difference between the second sample and the first. Further, the difference may be compared to a threshold value for determining the data value.

In another exemplary embodiment, referencing FIGS. 16, 19–21, the durations $t_1$–$t_2$ and $t_3$–$t_4$ of the first and second integrations may both be based upon sneak currents of the reference bitline as monitored in real-time. Such operating mode, 330 of FIG. 21, may be established by signal levels at mode input 264 (FIG. 16). In this alternative operation, sense amplifier 52 may again begin a first integration of the data bitline signal 332, responsive to a drop of SENSE RESET signal 132 at time t1. Additionally, the reference bitline may be disconnected from the $V_{BL}$ bitline offset bias.

Self-timer controller 262, further referencing FIG. 16, may respond to the drop in the SENSE RESET signal on line 256 to enable threshold source 268. Threshold source 268 of the self-timer circuitry may then establish a threshold drop between output 86 of buffer 90 and the input of sampling comparator circuit 274 (via pre-amplifier 270 in the illustrated embodiment). Additionally, controller 262 may further enable sampling comparator 274 responsive to the drop in the SENSE RESET signal. Being enabled, switches 436,438 (FIG. 24) of the sampling comparator 274 of the self-timing circuit may be opened and the output stage 428,430,432 also enabled. In this condition, the level of the reference bitline may be monitored (334,336,337 of FIG. 21) to establish a length of time for the duration of the first integration. The first integration may be sustained until determining that the level of the reference bitline signal (302' of FIG. 19) has reached (336,338 of FIG. 21) the level (303 of FIG. 19) established by threshold source 268.

When the level of the reference bitline $V_{86}(t_2)$ (output of buffer 90) minus the level of the threshold source 268 exceeds the bitline offset voltage $V_{BL}$, the input plates of sampling capacitors 402,404 may receive a voltage change from output 272 of the preamp 270. The change in this output voltage in turn may pump the levels of floating nodes 406,408 (FIG. 24) of the differential amplifier of sampling comparator 274. Eventually, the level of one node may reach and surpass the level of the other node. In response, sampling comparator 274 may drive its output 276 to trigger a conclusion for the duration of the first integration.

Self-timer controller 262 (FIG. 16) receives a transition of the sampling comparator's output 276 and may respond by activating the RESET COMPARATOR signal of line 242. A first sample (340 of FIG. 21) of the data integrator may be obtained by the sampling comparator 214 of the data bitline signal path. At about the same time, the self-timer controller 262 activates the self-timer's RESET COMPARATOR signal on line 252 and the second plates of sampling capacitors 402,404 (which are coupled to nodes 406,408 of the self-timer's sampling comparator 274) may be reset to equal levels by closing of the feedback switches 436,438.

After this, SENSE RESET signal 132' (FIG. 20) will transition high. Line 256 carries the high level to enable switch 96 and couple the reference bitline to the $V_{BL}$ bitline offset voltage source. The reference bitline reestablishes (342,343,346 of FIG. 21) its offset bias, as represented by signal 302' of FIG. 19 between times $t_2$ and $t_3$.

Starting the duration of the second integration, at time $t_3$ referencing FIGS. 19–20, SENSE RESET signal 132' transitions low and again opens switch 96 to disconnect the reference bitline 122 from the offset voltage of line 234 and opens switch 92 to enable the integrating amplifier. Additionally, self timer controller 262 drops the level of the self-timer-reset-comparator signal on line 252 to disable the feedback switches 436,438 of the self-timing-sampling comparator 274. Controller 262 also activates the signal on line 250 to enable the output 276 of the self timer sampling comparator 274 so that it may propagate a signal to controller 262. The controller will receive a signal transition from the comparator when the level of the signal of reference bitline 122 reaches a threshold level established by threshold voltage source 268.

Figure 23:
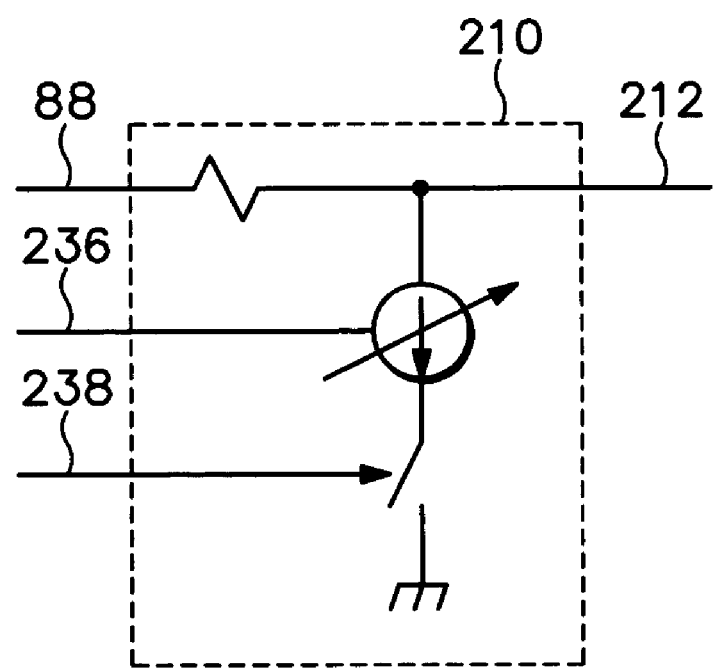
FIG. 23 is schematic diagrams of an offset adjust circuit for a threshold adjust of FIG. 16.

Threshold voltage source 268 may be enabled by a threshold enable signal of controller 262 on line 254. The level of the threshold voltage source 268 may be established via input 266. The threshold adjust circuits 268,210 may each comprise, referencing FIG. 23, a current source to draw a current through a resistor that is disposed in series with a signal path. Control line 236/266 may provide an adjust signal to set a level of the threshold offset, while enable line 238/254 may drive a switch to enable or disable operation of the current source. The amount of current established for the current source, therefore, sets the offset voltage for the signal path 88/86.

The second integration continues from time $t_3$ to time $t_4$, referencing FIG. 19–20, for integrating the signal of the data bitline relative to the signal of reference bitline (332 of FIG. 21). During this second integration, the level of the reference bitline may be monitored (334, 336, 337 of FIG. 21) until the level of the reference bitline may be determined to have reached (336, 338 of FIG. 21) the level of threshold source 268. Similarly as described before, once the level of the reference bitline reaches that of the threshold source 268, sampling comparator 274 may respond with an output transition (via line 276) to signal an end for the second integration and to enable (340 of FIG. 21) "a second sample" of the integrated data signal, which may be used for determining a data value.

Further referencing FIGS. 16 and 19–21 at time $t_4$, self timer controller 262 activates LATCH ENABLE signal on line 244 to close switches 218. Sampling comparator 214 and latch 222 may then determine (344, 326, 328 of FIG. 21) and latch a data value. Again, the determination may be based on a comparison of the difference between the first and second samples relative to a threshold.

Referencing FIG. 20, the dashed line representative of signal 304' includes two separate pulses, i.e., one just after the time $t_2$ and another just after time $t_4$. If the reference bitline has a defect, for example, a short to a supply or an absence of coupling to reference cells; then signal 302 (FIG. 19) of the reference bitline may not be able to ramp upwardly. Accordingly, the back-up pulses of SENSE STOP signal 304' (FIG. 20) may serve as default-stop(s) that may terminate respective first or second integrations should the level of the reference bitline not be able to reach the threshold before the arrival of the default pulses.

Further referencing FIG. 20, signal 306' may represent a sense-ready-out signal that may be generated by self-timer controller 262 to indicate when a data determination should be available for output on line 224 (FIG. 16). A read/write controller (e.g., 62 of FIG. 4) of a memory device may monitor the sense-ready-out signal of the self-timer control circuitry of sense amplifier 52 and may also monitor the sense-ready-out signals from other sense amplifier circuits. The multiple signals may be combined (e.g., per a logical AND function) to determine when all outputs of the multiple devices may be available. When all outputs are determined available, the multiple bits of data might then be presented simultaneously to an internal I/O bus 74 of the memory devices as illustrated in FIG. 4.

Figure 22:
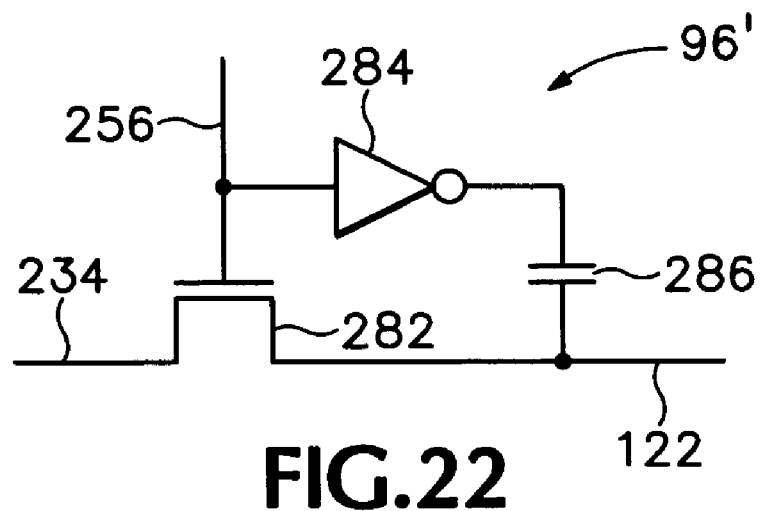
FIG. 22 is a schematic diagram of an exemplary switching circuit for the circuit of FIG. 16.

FIG. 22 shows an exemplary switching circuit 96' for switch 96 of FIG. 16. An NMOS transistor 282 may be coupled with its channel in series between the offset bias line 234 and reference bitline 122. The gate may be configured to receive the SENSE RESET signal of control line 256. Capacitor 286 may have one plate coupled to the reference bitline 122 and the other plate configured to receive the inverse of the SENSE RESET signal via inverter 284. Inverter 284 and capacitor 286 may cancel charge that may be coupled to the reference bitline 122 when a transition of the control signal on line 256 drives the gate of NMOS 282. Capacitor 286 and the voltage swing from the output of inverter 284 may be sized so as to subtract/add a quantity of charge to the reference bitline 122 similar to that affected by the charge transfer across the stray capacitance from the gate-to-drain of NMOS transistor 282. Such switching circuit 96' may also be used for other switches of the sense amplifier.

Processing System with Self-Timing

Figure 26:
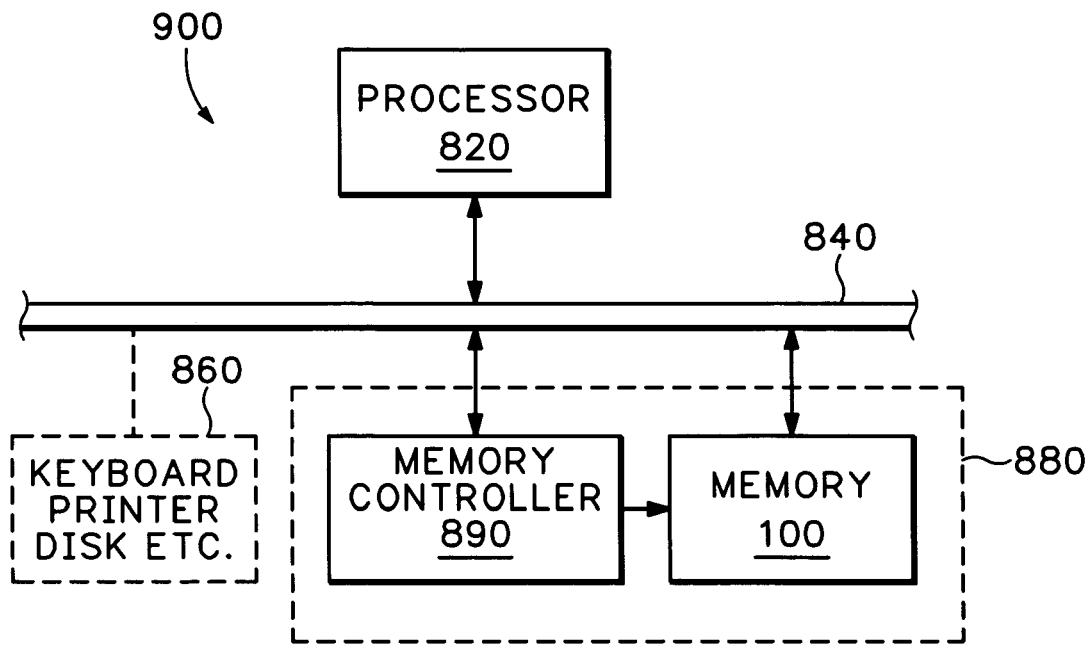
FIG. 26 is a block diagram of a data processing system.

Referencing FIG. 26, in accordance with a further exemplary embodiment, a data processing system 800 comprises a processor 820 that may communicate with a plurality of sub-systems by way of bus 840. For example, bus 840 may couple to sub-systems 860 such as, e.g., a keyboard, mouse, monitor, printer, network interface, disk system and the like. In accordance with this embodiment, bus 840 may also interface a memory module 880, which may communicate with processor 820 either directly or via memory controller 890.

Memory 100 of memory module 880 may comprise a memory device of a previously described embodiment—e.g., of an embodiment of FIGS. 4–25. For example, memory 100 may comprise a ferroelectric memory with sense amplifiers to determine data of memory cells. The sense amplifiers may determine the data values based on signals of data bitlines relative to signals of reference bitlines. Each of the sense amplifiers may include an integrator to integrate a signal of a data bitline relative to a signal of a reference bitline. A sampling-comparator may have a first portion to sample signals of the integrator and a second portion to compare the sampled values. In accordance with one embodiment, a timer may affect the integration durations of the integrator dependant upon the level of the signal on the reference bitline.

Conditioning and Testing

Returning to reference FIGS. 5A–5B, a select reference bitline 122 as selected by multiplexer $54_{RBL}$ may be coupled to buffer 90 of sense amps & drivers 52, while the selected data bitlines 16 may be coupled to their respective data sense amplifiers/drivers 80. Although signals can be applied to the selected data bitlines 16 via reconfiguration of the sense amplifiers/drivers 80 (e.g., enabling MOSFETs 92 to short respective capacitors 94); writing of the reference bitlines 122, on the other hand, may require alternative circuitry for enabling read/write operations of the reference bitlines as may be required for conditioning or testing.

Upon forming an array 46 of ferroelectric memory cells, local domains of ferroelectric material of the memory cells may have random, dielectric dipole orientations. Additionally, the orientations of the local domains may seem rigid, wherein the domains may seem resistant to alignment under the influence of external electric fields. To improve the ease by which their dipole alignments can be set, the ferroelectric material of the memory cells may be driven through a series of polarization reversal procedures, which may be described as a conditioning procedure. In accordance with one particular exemplary embodiment, the polarization reversals may be accomplished by sequentially and repetitively writing the ferroelectric memory cells with "1" data followed by "0" data. Further, the "0" data might alternatively be established within a cell via a read process (i.e., destructive read), wherein the read process itself may leave the cell in a zero-state polarization condition.

In accordance with an exemplary embodiment, the conditioning of reference cells of the ferroelectric memory array 46 may include driving the references cells through a series of polarization reversals similar to those that might otherwise be provided during conditioning of the other data cells within the array. By receiving similar conditioning, the reference cells may start-off with polarization characteristics to substantially emulate those of the data memory cells. But in order to accomplish such conditioning, additional circuitry configurations may be used to allow writing of one/zero data to the reference cells of the reference bitlines.

Figure 27:
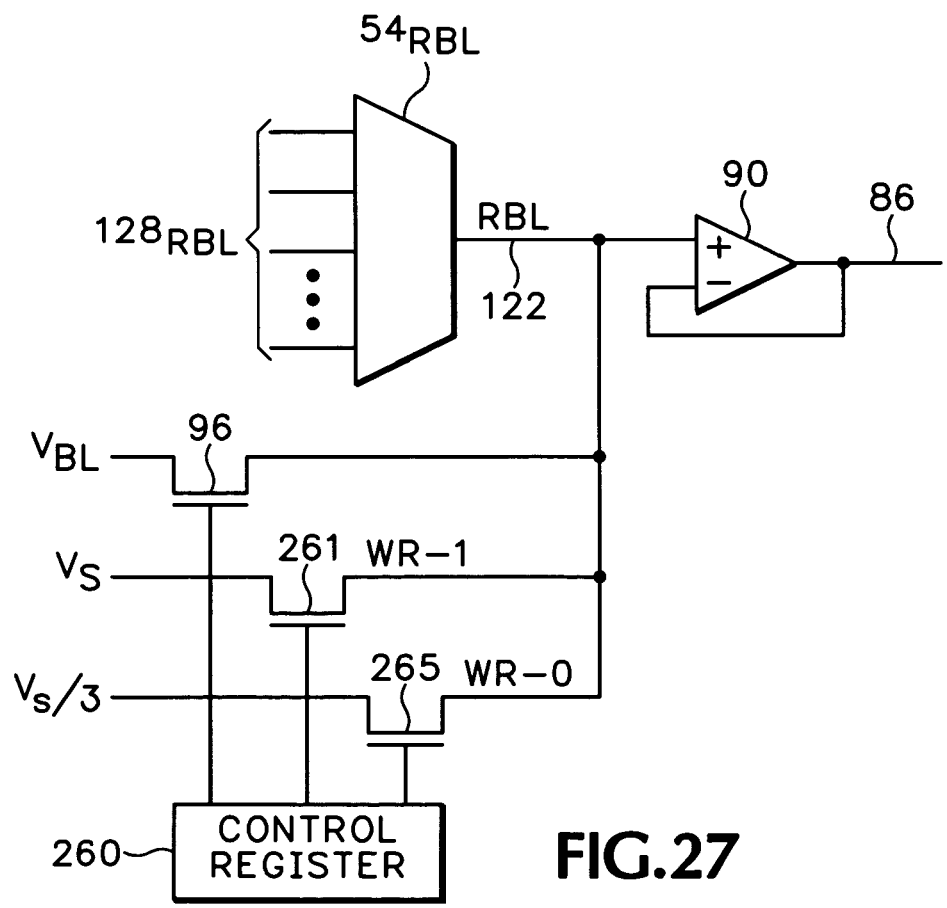
FIG. 27 is a simplified, schematic diagram showing a selective-biasing circuit of a ferroelectric memory device for an exemplary embodiment, which may be operable during conditioning or testing of reference bitlines of a ferroelectric memory.

In accordance with an exemplary embodiment, referencing FIG. 27, multiplexer $54_{RBL}$ receives configuration data (not shown) to determine which one of the plurality of reference bitlines $128_{RBL}$ to select for receiving conditioning voltages as established by control register 260. When data of control register 260 enables switch 261 and disables the other switches 96,265, voltage level Vs may be written into the reference cells of a select reference bitline 122. To write the reference cells with a low level Vs/3, control register 260 may enable switch 265 and disable switches 96,261.

In another embodiment of the present invention, switch 265 may be removed. Low levels may be written into the reference cells by enabling switch 96 and disabling switch 261 during a write sequence. Or, a read sequence may be used wherein signal 124 (FIG. 7) of an active wordline may transition to a level Vs while the reference bitline remains as 0 (i.e., $V_{BL}$). As a part of conditioning the reference cells, in accordance with further exemplary embodiments, the reference cells may be sequenced through at least ten alternating 0/1 data write (and read) procedures, and more typically between 30–100 such procedures.

Figure 28:
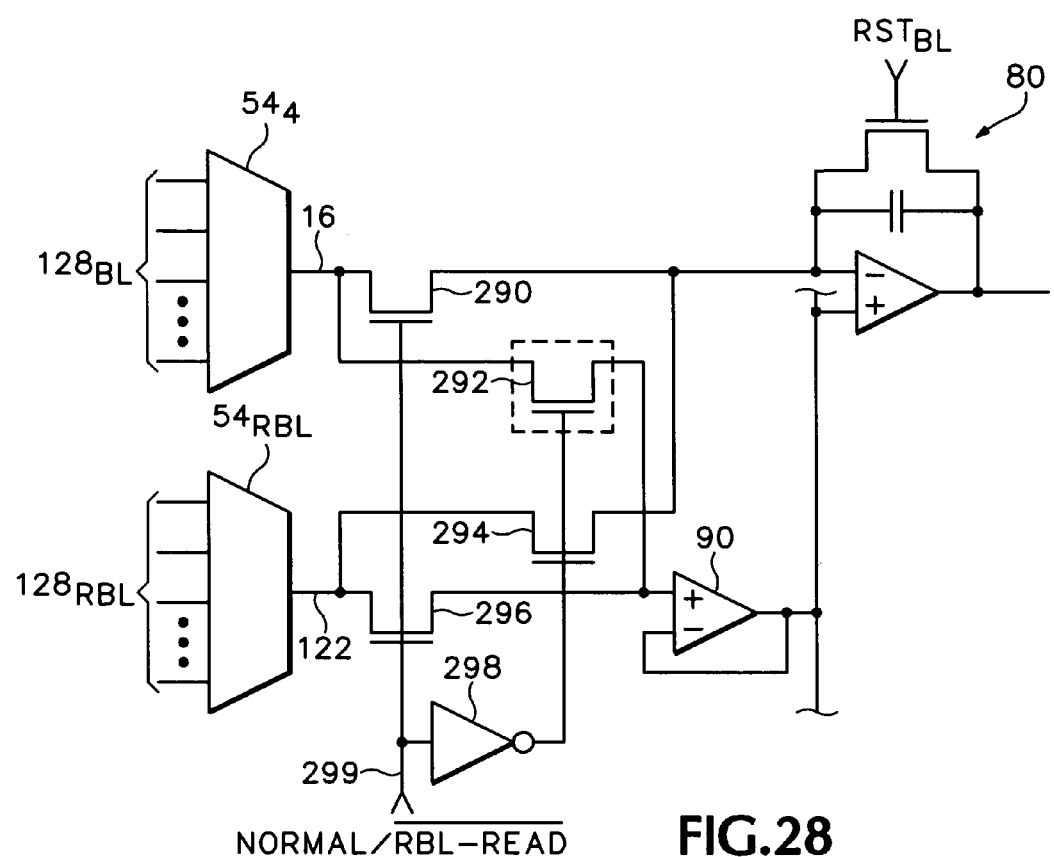
FIG. 28 is a simplified, schematic diagram showing selective re-routing circuitry of a ferroelectric memory for an exemplary embodiment, which may be operable to allow testing of reference bitlines of the ferroelectric memory.

Referencing FIG. 28, in accordance with another exemplary embodiment of the present invention, a switching-network (290–298) may be electrically disposed between multiplexer $54_4$ of the data bitlines $128_{BL}$, multiplexer $54_{RBL}$ of the reference bitlines $128_{RBL}$ and respective buffer 90 and sense amplifiers 80. The switching network will enable writing or writing and reading of the reference cells of the reference bitlines as though they were normal memory cells. Switches 290,292 (e.g., MOSFETs, pass-gates, etc) form a 1-of-2 multiplexer to propagate an output of multiplexer $54_4$ to one of either sense amplifier/driver 80 or voltage-follower buffer 90. Switches 294, 296 provide another 1-of-2 multiplexer that may selectively propagate an output of multiplexer $54_{RBL}$ to one of either sense amplifier/driver 80 or voltage-follower buffer 90.

During normal operation, further referencing FIG. 28, a high level control signal on line 299 may be applied to the input of inverter 298 and the gates of MOSFETs 290, 292. Switch 290 may be enabled to couple the selected data bitline 16 from the output of multiplexer $54_4$ to sense amplifier 80, while enabled switch 296 may couple the selected reference bitline 122 from the output of multiplexer $54_{RBL}$ to voltage follower buffer 90. Accordingly, normal read and write operations of the data bitlines $128_{BL}$ of the memory device may be performed while using the reference signals of the reference bitlines $128_{RBL}$.

In accordance with other exemplary embodiments of the present invention, the control signal on line 299 may be biased low for disabling switches 290,296 and enabling switches 292,294. Enabled switch 294 may couple the selected reference bitline 122 from the output of multiplexer $54_{RBL}$ to sense amplifier 80, while enabled switch 296 couples the selected data bitline 16 from the output of multiplexer $54_4$ to voltage follower or buffer 90. With such configuration of switches 290–298, reference bitlines are substituted for the data bitlines and reference cells of the reference bitlines may be written or read as though they were data memory cells. Additionally, the data memory cells may be used to establish reference levels that may be propagated to buffer 90 to assist sensing of the reference cells.

In exemplary operation for this embodiment, after switches 290–298 have been configured to selectively couple reference bitlines to the sense-amplifiers/drivers 80, reference cells of the reference bitlines $128_{RBL}$ may be conditioned by writing the reference cells sequentially with the one and zero data, via the existing write (read) procedures of the memory device.

Likewise, reference cells of the reference bitlines $128_{RBL}$ may be tested by subsequently reading their data and comparing the data read to that previously written therein. For example, if all reference cells of the reference bitline when read always yield a fixed result, regardless of the data previously written therein, then the associated reference bitline may be identified as faulty. For example, it might possibly suffer from a short to one of the supplies, e.g. $V_{BL}$, or perhaps a ferroelectric material of a reference cell may have a pinhole that electrically shorts the bitline of the faulty cell to the wordline voltage. Accordingly, by permitting reading and writing of reference cells of the reference bitlines via such exemplary embodiments of the present invention, the reference cells and reference bitlines may be conditioned and/or tested using the available read and write procedures of the ferroelectric memory device.

Reference bitlines and interfacing circuits of exemplary conditioning and testing embodiments described above may be responsive to controller 62 to allow conditioning or testing of the reference cells or reference bitlines. In accordance with a more particular exemplary embodiment, controller 62 may be selectively operable to couple designated reference bitlines to one of at least two separate supplies during a conditioning operation of the memory device. Further, the controller may alternatively configure the reference bitlines in substitution of data bitlines to allow read-write processes to condition or test such reference cells or reference bitlines.

It will be apparent to those skilled in this art that the illustrated embodiments are exemplary and that various changes and modifications may be made thereto as become apparent upon reading the present disclosure. Accordingly, such changes and modifications are considered to fall within the scope of the appended claims.

What is claimed is:

1. A ferroelectric memory device comprising:
    a plurality of bitlines;
    a sense amplifier to sense a signal of a select bitline of the plurality relative to that of a reference bitline of the plurality;
    an amplifier to source the sense amplifier with a reference signal representative of that of the reference bitline; and
    a read controller responsive to a read request to isolate the reference bitline from a voltage source.

2. A device according to claim 1, further comprising:
    a plurality of wordlines;
    an active wordline of the plurality crossing the active bitline and the reference bitline with ferroelectric material therebetween;
    a first voltage source to provide a read level voltage for biasing the active wordline; and
    a second voltage source to provide a quiescent level voltage for biasing wordlines of the plurality other than the active wordline;
    at least one of the first and second voltage sources comprising a supply switch electrically disposed in the serial path associated with the supply of respective read level or quiescent level voltages.

3. A device according to claim 2, in which the at least one of the first and second voltage sources further comprises a capacitor electrically coupled to the serial path on a side of the supply switch opposite the supply.

4. A device according to claim 3, in which the capacitor comprises at least one of a doped-well in a semiconductor substrate and insulated gate of a drain-source shorted MOSFET formed within the semiconductor substrate.

5. A device according to claim 4, in which the plurality of wordlines and bitlines of the ferroelectric memory device form an array of ferroelectric memory cells, the array of ferroelectric memory cells disposed over at least a portion of the doped-well of the semiconductor substrate.

6. A device according to claim 5, in which the supply switch is disposed on the semiconductor substrate.

7. A device according to claim 2, in which
    the supply switch comprises at least one MOSFET having its channel disposed between the plurality of wordlines and the supply; and
    the read controller to drive the gate of the at least one MOSFET responsive to the read request.

8. A device according to claim 2, in which
    the supply switch comprises first and second MOSFETs having channels coupled in parallel with each other, the parallel channels together within the serial path to the supply; and
    the read controller to drive the gates of the first and second MOSFETs separately.

9. A device according to claim 1, in which the switch comprises a MOSFET having its channel electrically disposed in series with an electrical path between the reference bitline and the reference voltage source.

* * * * *